(12) United States Patent
Okuma et al.

(10) Patent No.: US 10,532,431 B2
(45) Date of Patent: *Jan. 14, 2020

(54) LASER PROCESSING METHOD

(71) Applicant: HAMAMATSU PHOTONIC K.K., Hamamatsu-shi, Shizuoka (JP)

(72) Inventors: Junji Okuma, Hamamatsu (JP); Takeshi Sakamoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 617 days.

This patent is subject to a terminal disclaimer.

(21) Appl. No.: 15/043,295

(22) Filed: Feb. 12, 2016

(65) Prior Publication Data

US 2016/0163549 A1 Jun. 9, 2016

Related U.S. Application Data

(63) Continuation of application No. 13/979,178, filed as application No. PCT/JP2011/079079 on Dec. 15, 2011, now Pat. No. 9,295,969.

(30) Foreign Application Priority Data

Jan. 13, 2011 (JP) .................................. 2011-005195

(51) Int. Cl.
*B23K 26/53* (2014.01)
*B23K 26/00* (2014.01)
(Continued)

(52) U.S. Cl.
CPC .......... *B23K 26/53* (2015.10); *B23K 26/0006* (2013.01); *B23K 26/0622* (2015.10);
(Continued)

(58) Field of Classification Search
CPC ..... B23K 26/0057; B23K 26/57; B23K 26/53
See application file for complete search history.

(56) References Cited

U.S. PATENT DOCUMENTS 4,546,231 A 10/1985 Gresser et al.
5,637,244 A 6/1997 Erokhin
(Continued)

FOREIGN PATENT DOCUMENTS

CN 1473087 A 2/2004
CN 1703770 A 11/2005
(Continued)

OTHER PUBLICATIONS

Reissue U.S. Appl. No. 14/148,180 to Kumagai filed Jan. 6, 2014.
(Continued)

*Primary Examiner* — Matthew J Daniels
(74) *Attorney, Agent, or Firm* — Drinker Biddle & Reath LLP

(57) ABSTRACT

A planar object to be processed 1 comprising a hexagonal SiC substrate 12 having a front face 12a forming an angle corresponding to an off-angle with a c-plane is prepared. Subsequently, the object 1 is irradiated with pulse-oscillated laser light L along lines to cut 5a, 5m such that a pulse pitch becomes 10 μm to 18 μm while locating a converging point P of the laser light L within the SiC substrate 12. Thereby, modified regions 7a, 7m to become cutting start points are formed within the SiC substrate 12 along the lines 5a, 5m.

6 Claims, 34 Drawing Sheets

(51) Int. Cl.

| | |
|---|---|
| *B23K 26/0622* | (2014.01) |
| *B23K 26/08* | (2014.01) |
| *B28D 5/00* | (2006.01) |
| *H01L 21/304* | (2006.01) |
| *H01L 29/16* | (2006.01) |
| *C30B 29/36* | (2006.01) |
| *C30B 33/06* | (2006.01) |
| *H01L 21/78* | (2006.01) |
| *H01L 23/544* | (2006.01) |
| *B23K 101/18* | (2006.01) |
| *B23K 101/40* | (2006.01) |
| *B23K 103/00* | (2006.01) |

(52) U.S. Cl.
CPC ........ *B23K 26/0853* (2013.01); *B28D 5/0011* (2013.01); *C30B 29/36* (2013.01); *C30B 33/06* (2013.01); *H01L 21/304* (2013.01); *H01L 21/78* (2013.01); *H01L 23/544* (2013.01); *H01L 29/1608* (2013.01); *B23K 2101/18* (2018.08); *B23K 2101/40* (2018.08); *B23K 2103/50* (2018.08); *H01L 2223/54453* (2013.01)

(56) References Cited

U.S. PATENT DOCUMENTS

| | | |
|---|---|---|
| 5,952,679 A | 9/1999 | Kitou et al. |
| 6,211,488 B1 | 4/2001 | Hoekstra et al. |
| 7,605,344 B2 | 10/2009 | Fukumitsu |
| 2004/0002199 A1 | 1/2004 | Fukuyo et al. |
| 2005/0006361 A1 | 1/2005 | Kobayashi et al. |
| 2005/0009301 A1 | 1/2005 | Nagai et al. |
| 2005/0090077 A1 | 4/2005 | Nagai et al. |
| 2005/0098548 A1 | 5/2005 | Kobayashi et al. |
| 2005/0130390 A1 | 6/2005 | Andrews et al. |
| 2005/0199592 A1* | 9/2005 | Iri .................. B28D 5/0011 219/121.6 |
| 2005/0272223 A1 | 12/2005 | Fujii et al. |
| 2006/0040472 A1 | 2/2006 | Tamura et al. |
| 2006/0108338 A1 | 5/2006 | Nishiwaki et al. |
| 2006/0144828 A1 | 7/2006 | Fukumitsu et al. |
| 2007/0085099 A1 | 4/2007 | Fukumitsu et al. |
| 2007/0111481 A1 | 5/2007 | Tamura et al. |
| 2007/0170159 A1 | 7/2007 | Fukumitsu |
| 2007/0202619 A1 | 8/2007 | Tamura et al. |
| 2007/0207594 A1 | 9/2007 | Tamura |
| 2007/0252154 A1 | 11/2007 | Uchiyama et al. |
| 2007/0298529 A1 | 12/2007 | Maeda et al. |
| 2008/0000884 A1 | 1/2008 | Sugiura et al. |
| 2008/0008641 A1 | 1/2008 | Leonard et al. |
| 2008/0035611 A1 | 2/2008 | Kuno et al. |
| 2009/0101936 A1 | 4/2009 | Kamei et al. |
| 2009/0107967 A1 | 4/2009 | Sakamoto et al. |
| 2009/0117712 A1 | 5/2009 | Sakamoto et al. |
| 2010/0012632 A1 | 1/2010 | Sakamoto |
| 2010/0148212 A1 | 6/2010 | Fujito et al. |
| 2010/0193800 A1 | 8/2010 | Uchida et al. |
| 2010/0200550 A1 | 8/2010 | Kumagai |
| 2010/0295060 A1 | 11/2010 | Kudou et al. |
| 2011/0266261 A1 | 11/2011 | Nakano et al. |
| 2011/0300691 A1 | 12/2011 | Sakamoto et al. |
| 2012/0329247 A1 | 12/2012 | Sakamoto |

FOREIGN PATENT DOCUMENTS

| | | |
|---|---|---|
| CN | 1717784 A | 1/2006 |
| CN | 1758986 A | 4/2006 |
| CN | 1967783 A | 5/2007 |
| CN | 1983556 A | 6/2007 |
| CN | 1993201 A | 7/2007 |
| CN | 101146642 A | 3/2008 |
| CN | 101400475 A | 4/2009 |
| CN | 101641766 A | 2/2010 |
| CN | 101689565 A | 3/2010 |
| CN | 101842184 A | 9/2010 |
| JP | 2005-086175 A | 3/2005 |
| JP | 2005-166728 A | 6/2005 |
| JP | 2005-235993 A | 9/2005 |
| JP | 2006-074025 A | 3/2006 |
| JP | 2007-514315 A | 5/2007 |
| JP | 2009-147108 A | 7/2009 |
| JP | 2009-206221 A | 9/2009 |
| JP | 2010-000542 A | 1/2010 |
| JP | 4435864 B2 | 3/2010 |
| JP | 2010-135829 A | 6/2010 |
| JP | 2010-225756 A | 10/2010 |
| KR | 2010-0017798 A | 2/2010 |
| KR | 2010-0076918 A | 7/2010 |
| TW | 200913330 A | 3/2009 |
| TW | 201041178 A | 11/2010 |
| WO | WO-2006/051866 A1 | 5/2006 |

OTHER PUBLICATIONS

"Materials for High-Temperature Semiconductor Devices," Committee on Materials for High-Temperature Semiconductor Devices, National Materials Advisory Board Commission on Engineering and Technical Systems National Research Council, 1995, Chapter 2 (State of the Art of Wide Bandgap Materials), pp. 15-19.

* cited by examiner

Fig. 19

| Pulse width (ns) | 1 | 10 | 20 | 30 | 40 | 50 | 60 | 70 | 80 | 90 | 100 | 120 |
|---|---|---|---|---|---|---|---|---|---|---|---|---|
| ID threshold | poor | fair | fair | good | good | excellent | excellent | excellent | excellent | excellent | excellent | excellent |
| HC threshold | excellent | excellent | excellent | excellent | good | good | good | good | fair | fair | fair | poor |
| Processing margin | poor | fair | fair | fair | good | excellent | excellent | good | fair | fair | fair | fair |
| Total | poor | fair | fair | good | good | excellent | excellent | good | good | fair | fair | poor |

Fig.20

| Pulse pitch (μm) | 6 | 8 | 10 | 11 | 12 | 14 | 15 | 16 | 18 | 20 | 22 |
|---|---|---|---|---|---|---|---|---|---|---|---|
| ID threshold | poor | poor | fair | good | good | excellent | excellent | excellent | excellent | excellent | excellent |
| HC threshold | excellent | excellent | good | good | good | good | good | fair | fair | poor | poor |
| Processing margin | poor | poor | fair | good | good | excellent | excellent | good | good | poor | poor |
| Total | poor | poor | fair | good | good | excellent | excellent | good | good | poor | poor |

*Fig. 21*

Pulse Width 27ns (NA0.8)

Pulse pitch (µm)

| Energy (µJ) | Power (W) | 6 | 8 | 10 | 12 | 14 | 16 | 18 | 20 |
|---|---|---|---|---|---|---|---|---|---|
| 11.0 | 0.110 | ST | | | | | | | |
| 12.0 | 0.120 | ID(5) LV3 | ST | | | | | | |
| 13.0 | 0.130 | ID(10) LV3 | HC(10) | ST | | | | | |
| 14.0 | 0.140 | ID(10) LV3 | ID(10) LV2 | HC(6) | ST | | | | |
| 15.0 | 0.150 | | HC(12) | HC(10) | ST | | | | |
| 16.0 | 0.160 | | ID(15) LV3 | HC(12) | HC(10) | ST | | | |
| 17.0 | 0.170 | | ID(19) LV2 | ID(17) LV3 | ID(12) LV3 | HC(12) | ST | | |
| 18.0 | 0.180 | | ID(17) LV3 | ID(17) LV1 | HC(17) | HC(15) | ST | | |
| 19.0 | 0.190 | | | HC(19) | LV1 | HC(17) | HC(12) | ST | |
| 20.0 | 0.200 | | | ID(17) LV3 | ID(19) LV3 | HC(19) | HC(12) | HC(9) | |
| 21.0 | 0.210 | | | ID(24) LV3 | ID(20) LV3 | HC(24) | HC(17) | HC(12) | HC(10) |
| 22.0 | 0.220 | | | | | ID(19) LV2 LV3 | ID(19) LV1 | HC(12) | HC(15) |
| 23.0 | 0.230 | | | | | ID(24) LV2 | ID(19) LV3 | HC(12) | HC(15) |
| 24.0 | 0.240 | | | | | | LV3 | HC(14) | HC(15) |
| 25.0 | 0.250 | | | | | | ID(19) LV1 | HC(15) | HC(15) |
| 26.0 | 0.260 | | | | | | ID(17) LV3 | HC(21) | HC(17) |
| 27.0 | 0.270 | | | | | | ID(19) LV2 | ID(19) LV1 | HC(19) |
| 28.0 | 0.280 | | | | | | | ID(19) LV2 | ID(19) LV2 |
| 29.0 | 0.290 | | | | | | | ID(19) LV2 | ID(20) LV2 |

HC threshold

ID threshold

Fig.27

Pulse Width 27ns (NA0.6)

Pulse pitch (μm)

| Energy (μJ) | Power (W) | 6 | 8 | 10 | 12 | 14 | 16 | 18 | 20 |
|---|---|---|---|---|---|---|---|---|---|
| 6.0 | 0.060 | ST | | | | | | | |
| 7.0 | 0.070 | ID(6) | ST | | | | | | |
| 8.0 | 0.080 | HC(6) | HC(6) | ST | | | | | |
| 9.0 | 0.090 | ID(8) | HC(8) | HC(8) | | | | | |
| 10.0 | 0.100 | LV2 | HC(12) | HC(8) | ST | | | | |
| 11.0 | 0.110 | | ID(12) | ID(10) | HC(6) | | | | |
| 12.0 | 0.120 | | ID(12) | ID(10) | HC(6) | ST | | | |
| 13.0 | 0.130 | | ID(12) | LV1 | HC(8) | HC(6) | | | |
| 14.0 | 0.140 | | | LV3 | HC(10) | HC(8) | ST | | |
| 15.0 | 0.150 | | | LV3 | HC(12) | HC(12) | HC(6) | | |
| 16.0 | 0.160 | | | | HC(12) | HC(12) | HC(8) | ST | |
| 17.0 | 0.170 | | | | HC(12) | ID(14) | HC(10) | HC(6) | ST |
| 18.0 | 0.180 | | | | | ID(14) | LV1 | HC(6) | HC(6) |
| 19.0 | 0.190 | | | | | ID(16) | LV1 | HC(16) | HC(10) |
| | | | | | | | LV2 | OD | OD HC(10) |
| | | | | | | | | OD | OD HC(10) |
| 20.0 | 0.200 | | | | | | | ID(16) LV1 | HC(10) |

HC threshold
ID threshold

Fig.28

Pulse Width 40ns (NA0.6)

| Energy (µJ) | Power (W) | Pulse pitch (µm) | | | | | | | |
|---|---|---|---|---|---|---|---|---|---|
| | | 6 | 8 | 10 | 12 | 14 | 16 | 18 | 20 |
| 6.0 | 0.060 | ST | | | | | | | |
| 7.0 | 0.140 | ID(6) LEV3 | ST | | | | | | |
| 8.0 | 0.160 | ID(8) LEV3 | HC(6) | ST | | | | | |
| 9.0 | 0.180 | | HC(8) | HC(6) | | | | | |
| 10.0 | 0.200 | | HC(8) | HC(7) | | | | | |
| 11.0 | 0.220 | | ID(10) LV1 | HC(6) | | | | | |
| 12.0 | 0.240 | | ID(15) LV2 | HC(10) | ST | | | | |
| 13.0 | 0.260 | | | HC(10) | HC(6) | | | | |
| 14.0 | 0.280 | | | HC(10) | HC(8) | ST | | | |
| 15.0 | 0.300 | | | HC(12) | HC(12) | HC(6) | | | |
| 16.0 | 0.320 | | | HC(14) | HC(12) | HC(8) | ST | | |
| 17.0 | 0.340 | | | HC(14) | HC(14) | HC(10) | HC(6) | | |
| 18.0 | 0.360 | | | ID(15) LV3 | HC(16) | HC(14) | HC(8) | ST | |
| 19.0 | 0.380 | | | | HC(16) | OD | HC(10) | HC(6) | |
| 20.0 | 0.400 | | | | | OD | OD | HC(12) | HC(8) |

HC threshold
ID threshold

Fig.31

| Converging point position (μm) | Pulse width (ns)/energy (μJ) | | | |
|---|---|---|---|---|
| | 27/9 | 40/8 | 50/10 | 57/11 |
| 25.3 | fissure | fissure | many fissures | branched |
| 28.4 | fissure | many branches | many branches | 7 |
| 31.5 | many branches | branched | 7 | 7 |
| 34.5 | branched | 5 | 7 | 6 |
| 37.6 | 5 | 4 | 5 | 5 |
| 40.6 | 4 | 4 | 4 | 4 |
| 43.7 | ST | ST | ST | ST | processing margin

Fig.32

| Energy (μJ) | Pulse width (ns) | | | | |
| --- | --- | --- | --- | --- | --- |
| | 27 | 40 | 50 | 57 | HC threshold |
| 7 | ST | ST | ST | ST | |
| 8 | ST | ST | 3 | 4 | |
| 9 | 4 | 5 | 5 | 6 | |
| 10 | 5 | 7 | 6 | 6 | |
| 11 | 8 | 8 | 7 | 7 | |
| 12 | 8 | 8 | 7 | 8 | |

Fig.33

| Energy (μJ) | Pulse pitch (μm) | | | | | |
|---|---|---|---|---|---|---|
| | 10 | 12 | 14 | 16 | 18 | |
| 7 | ST | ST | ST | ST | ST | |
| 8 | 3 | ST | ST | 3 | ST | HC threshold |
| 9 | 5 | 4 | 4 | 4 | 4 | |
| 10 | 6 | 5 | 5 | 5 | 5 | |
| 11 | 10 | 6 | 6 | 6 | 6 | |
| 12 | 10 | 8 | 8 | 6 | 7 | |

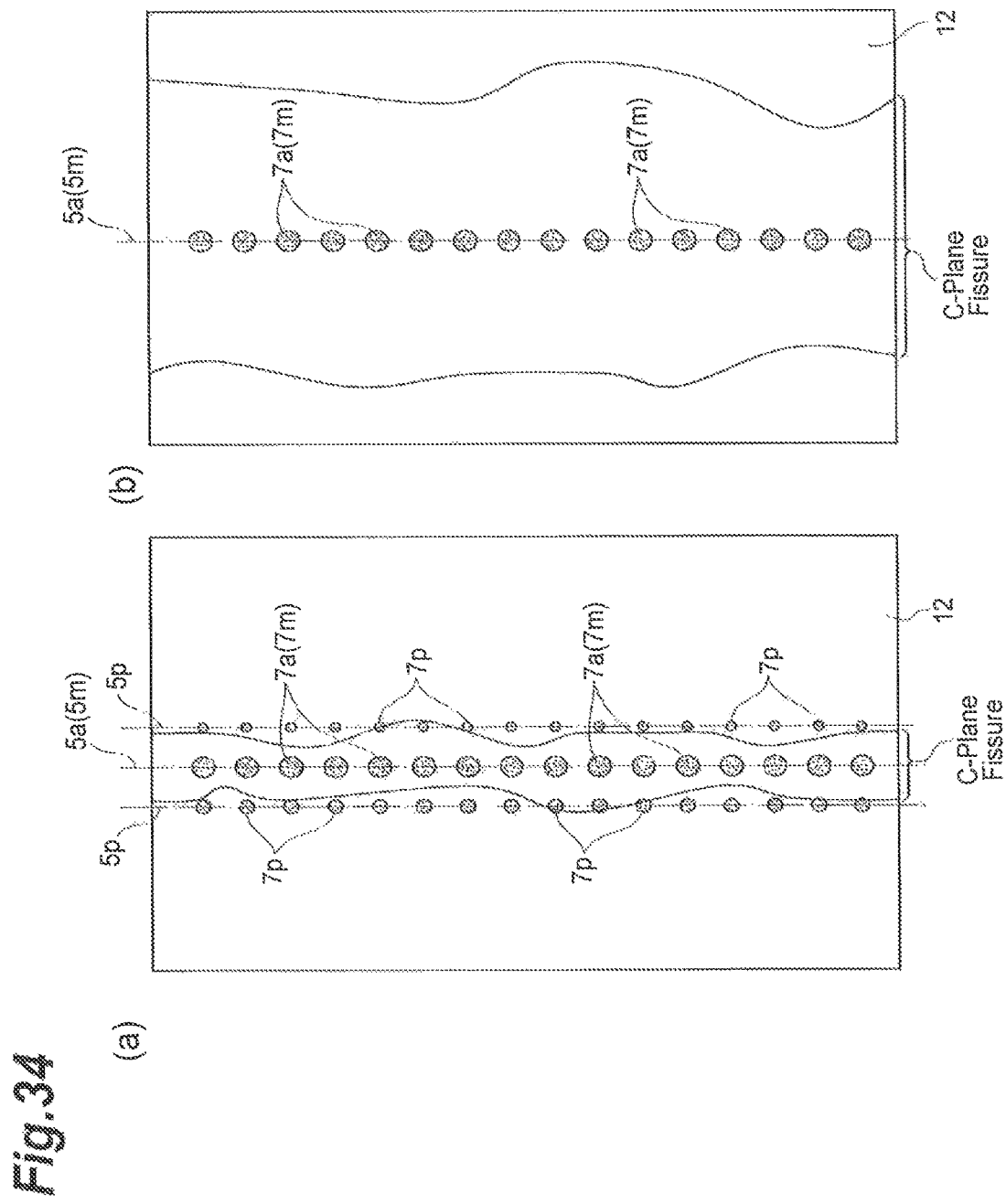

LASER PROCESSING METHOD

This is a continuation application of copending application Ser. No. 13/979,178 filed on Sep. 20, 2013, which is a national stage application of international Patent Application No. PCT/JP2011/079079 filed on Dec. 15, 2011; the entire contents of each of these are incorporated by reference herein in their entirety.

TECHNICAL FIELD

The present invention relates to a laser processing method for cutting a planar object to be processed comprising an SiC substrate along a line to cut.

BACKGROUND ART

Attention has been drawn to SiC (silicon carbide) as a semiconductor material which can manufacture power devices excellent in heat resistance, high voltage resistance, and power saving. However, SiC is a material which has the second highest hardness behind diamond and thus is hard to process, whereby low-speed processing or frequent blade replacement is required when a planar object to be processed comprising an SiC substrate is to be cut by blade dicing. Hence, a laser processing method has been proposed, which irradiates the object with laser light, so as to form a modified region within the SiC substrate along a line to cut, thereby cutting the object along the line from the modified region acting as a start point (see, for example, Patent Literature 1).

CITATION LIST

Patent Literature

Patent Literature 1: Japanese Translated International Application Laid-Open No. 2007-514315

SUMMARY OF INVENTION

Technical Problem

Meanwhile, the inventors have found that the following problem exists when cutting a planar object comprising a hexagonal SiC substrate having a main surface forming an angle corresponding to an off-angle with a c-plane by a laser processing method such as the one mentioned above. That is, when irradiating the object with the laser light such that fractures are easier to extend in the thickness direction of the SiC substrate from the modified region in order for the fractures to reach a laser light entrance surface of the SiC substrate from the modified region, fractures are also easier to extend in the c-plane direction from the modified region.

It is therefore an object of the present invention to provide a laser processing method which can cut a planar object to be processed comprising a hexagonal SiC substrate having a main surface forming an angle corresponding to an off-angle with a c-plane, accurately along a line to cut.

Solution to Problem

The laser processing method in accordance with one aspect of the present invention is a laser processing method for cutting a planar object to be processed comprising a hexagonal SiC substrate having a main surface forming an angle corresponding to an off-angle with a c-plane, along a line to cut, the method comprising the step of irradiating the object with pulse-oscillated laser light along the line such that a pulse pitch becomes 10 μm to 18 μm while locating a converging point of the laser light within the SiC substrate, thereby forming a modified region to become a cutting start point within the SiC substrate along the line.

This laser processing method irradiates the object along the line such that the pulse pitch (value obtained by dividing the moving speed of the converging point of the laser light with respect to the object by the repetition frequency of the pulsed laser light) becomes 10 μm to 18 μm. Irradiating the object with the laser light under such a condition can make fractures extend from the modified region easier in the thickness direction but harder in the c-plane direction. Therefore, this laser processing method makes it possible to cut the planar object comprising a hexagonal SiC substrate having a main surface forming an angle corresponding to an off-angle with the c-plane accurately along the line. The off-angle may be 0°. This makes the main surface parallel to the c-plane.

The laser processing method in accordance with one aspect of the present invention may irradiate the object with the laser light along the line such that the pulse pitch becomes 12 μm to 14 μm. This can make fractures extend from the modified region further easier in the thickness direction but further harder in the c-plane direction.

The laser processing method in accordance with one aspect of the present invention may pulse-oscillate the laser light at a pulse width of 20 ns to 100 ns or 50 ns to 60 ns. This can more securely make the fractures extend from the modified region easier in the thickness direction but harder in the c-plane direction.

The laser processing method in accordance with one aspect of the present invention may cut the object along the line from the modified region acting as a start point after forming the modified region. This can yield the object accurately cut along the line.

In the laser processing method in accordance with one aspect of the present invention, the modified region may include a molten processed region.

Advantageous Effects of Invention

The present invention can cut a planar object to be processed comprising a hexagonal SiC substrate having a main surface forming an angle corresponding to an off-angle with a c-plane, accurately along a line to cut.

BRIEF DESCRIPTION OF DRAWINGS

FIG. 19 is a table illustrating relationships between pulse width and ID threshold, HC threshold, and processing margin;

FIG. 20 is a table illustrating relationships between pulse pitch and ID threshold, HC threshold, and processing margin;

FIG. 21 is a table illustrating results of experiments concerning processing margin with respect to pulse width and pulse pitch;

FIG. 27 is a table illustrating results of experiments concerning processing margin with respect to pulse width and pulse pitch;

FIG. 28 is a table illustrating results of experiments concerning processing margin with respect to pulse width and pulse pitch;

FIG. 31 is a table illustrating results of experiments concerning processing margin with respect to HC quality in the vicinity of a laser light entrance surface;

FIG. 32 is a table illustrating results of experiments concerning processing margin with respect to HC quality in the vicinity of the laser light entrance surface;

FIG. 33 is a table illustrating results of experiments concerning processing margin with respect to HC quality in the vicinity of the laser light entrance surface; and FIG. 34 is a plan view for explaining the laser processing method in accordance with another embodiment of the present invention.

DESCRIPTION OF EMBODIMENTS

Figure 1:
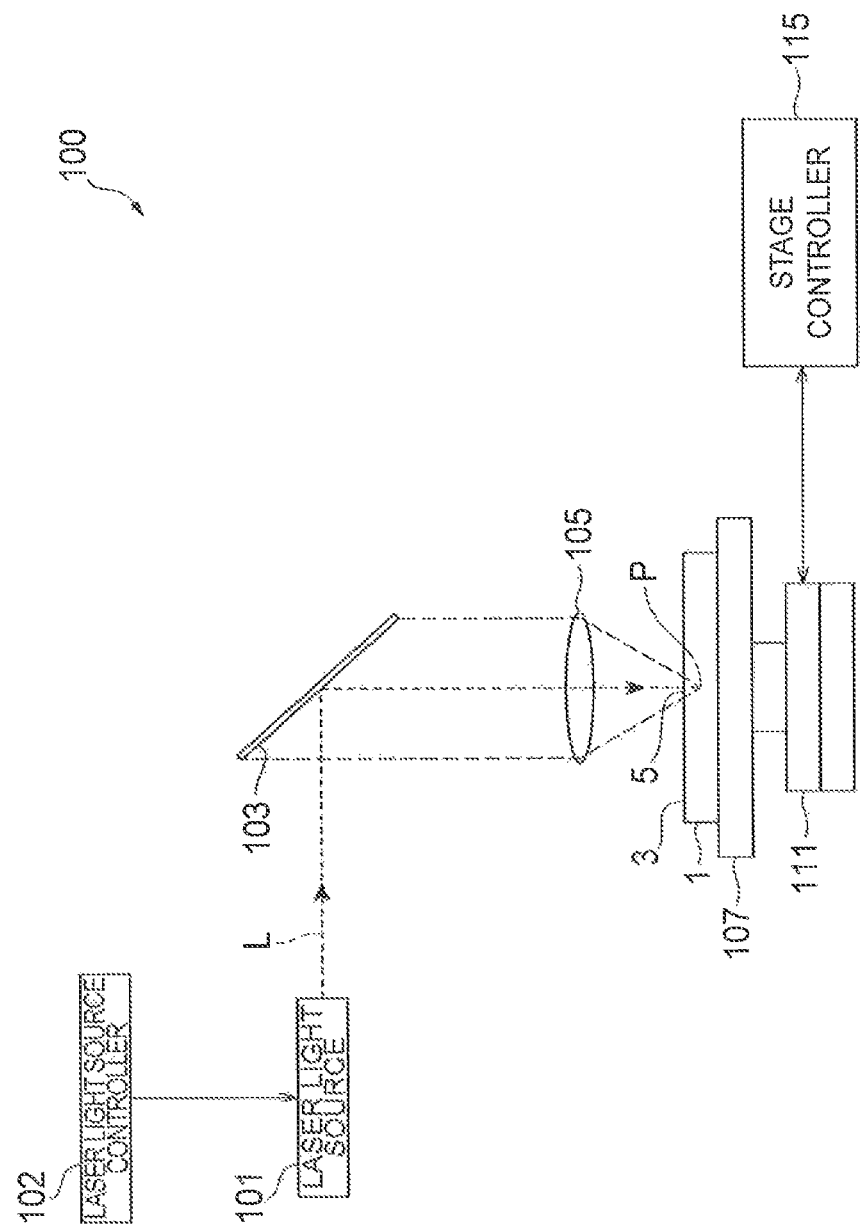
FIG. 1 is a structural diagram of a laser processing device used for forming a modified region.

In the following, preferred embodiments of the present invention will be explained in detail with reference to the drawings. In the drawings, the same or equivalent parts will be referred to with the same signs while omitting their overlapping descriptions.

The laser processing method in accordance with an embodiment of the present invention irradiates a planar object to be processed with laser light along a line to cut, so as to form a modified region within the object along the line. Therefore, the forming of the modified region will firstly be explained with reference to FIGS. 1 to 6.

As illustrated in FIG. 1, a laser processing device 100 comprises a laser light source 101 for causing laser light L to oscillate in a pulsating manner, a dichroic mirror 103 arranged such as to change the direction of the optical axis (optical path) of the laser light L by 90°, and a condenser lens 105 for converging the laser light L. The laser processing device 100 further comprises a support table 107 for supporting an object to be processed 1 which is irradiated with the laser light L converged by the condenser lens 105, a stage 111 for moving the support table 107, a laser light source controller 102 for regulating the laser light source 101 in order to adjust the output, pulse width, and the like of the laser light L, and a stage controller 115 for regulating the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut 5. This forms a modified region in the object 1 along the line 5.

Figure 2:
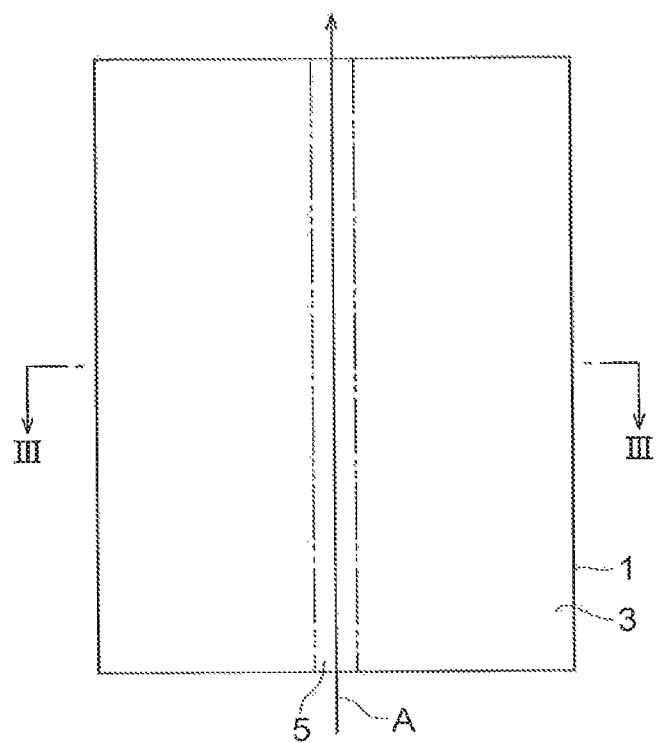
FIG. 2 is a plan view of an object to be processed before laser processing.
Figure 3:
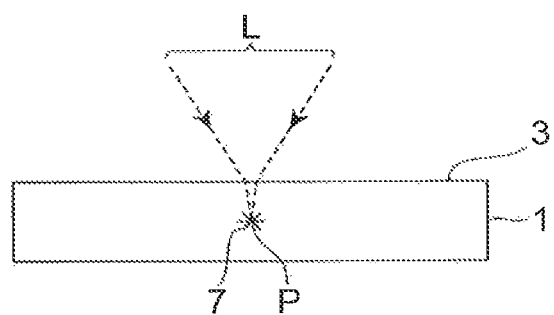
FIG. 3 is a sectional view of the object taken along the line III-III of FIG. 2.
Figure 4:
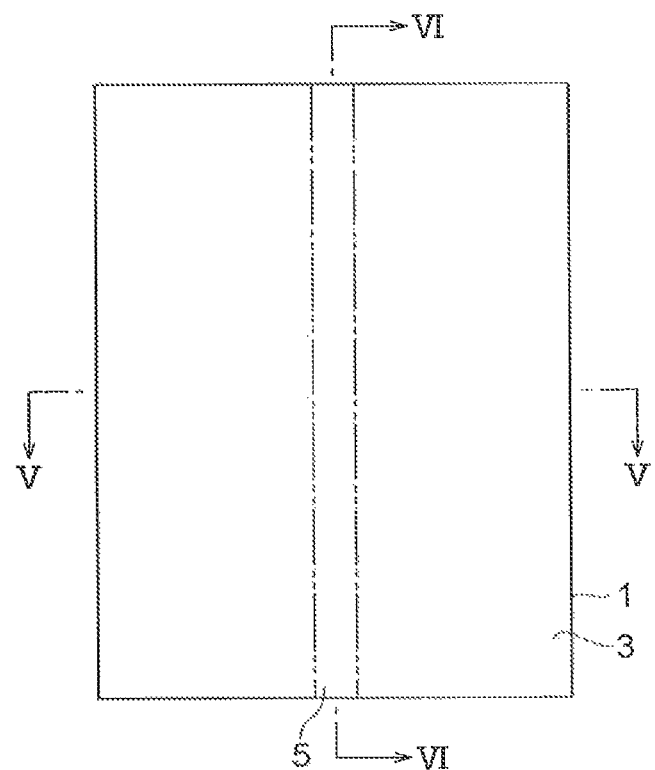
FIG. 4 is a plan view of the object after laser processing.
Figure 5:
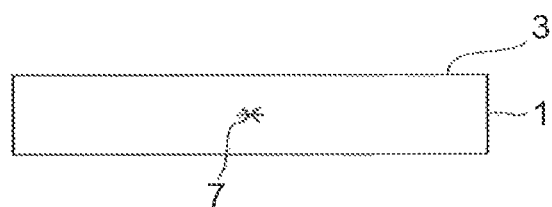
FIG. 5 is a sectional view of the object taken along the line V-V of FIG. 4.
Figure 6:
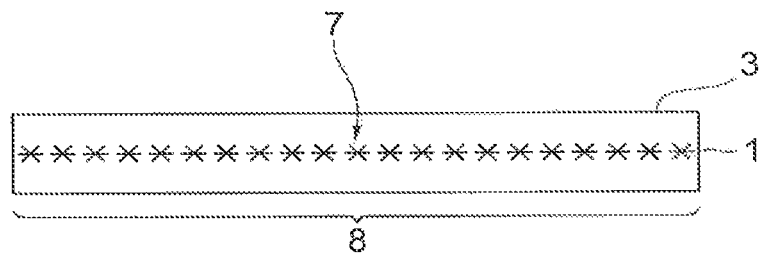
FIG. 6 is a sectional view of the object taken along the line VI-VI of FIG. 4.

As illustrated in FIG. 2, the line 5 for cutting the object 1 is set therein. The line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 formed along the line 5 becomes a starting point region for cutting 8.

The converging point P is a position at which the laser light L is converged. The line 5 may be curved instead of being straight or a line actually drawn on the front face 3 of the object 1 without being restricted to the virtual line. The modified region 7 may be formed either continuously or intermittently. The modified region 7 may be formed either in rows or dots, and it will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral surface) of the object 1.

Here, the laser light L is absorbed in particular in the vicinity of the converging point within the object 1 while being transmitted therethrough, whereby the modified region 7 is formed in the object 1 (internal absorption type laser processing). Therefore, the front face 3 of the object 1 hardly absorbs the laser light L and thus does not melt. In the case of forming a removing part such as a hole or groove by melting it away from the front face 3 (surface absorption type laser processing), the processing region gradually progresses from the front face 3 side to the rear face side in general.

By the modified region formed in this embodiment are meant regions whose physical characteristics such as density, refractive index, and mechanical strength have attained states different from those of their surroundings. Examples of the modified region include molten processed regions, crack regions, dielectric breakdown regions, refractive index changed regions, and their mixed regions. Other examples of the modified region include areas where the density of the modified region has changed from that of an unmodified region and areas formed with a lattice defect in a material of the object (which may also collectively be referred to as high-density transitional regions).

The molten processed regions, refractive index changed regions, areas where the modified region has a density different from that of the unmodified region, or areas formed with a lattice defect may further incorporate a fracture (fissure or microcrack) therewithin or at an interface between the modified and unmodified regions. The incorporated fracture may be formed over the whole surface of the modified region or in only a part or a plurality of parts thereof.

This embodiment forms a plurality of modified spots (processing scars) along the line 5, thereby producing the modified region 7. The modified spots, each of which is a modified part formed by a shot of one pulse of pulsed laser light (i.e., one pulse of laser irradiation; laser shot), gather to yield the modified region 7. Examples of the modified spots include crack spots, molten processed spots, refractive index changed spots, and those in which at least one of them is mixed.

Preferably, for the modified spots, their sizes and lengths of fractures generated therefrom are controlled as appropriate in view of the required cutting accuracy, the demanded flatness of cut surfaces, the thickness, kind, and crystal orientation of the object, and the like.

Figure 7:
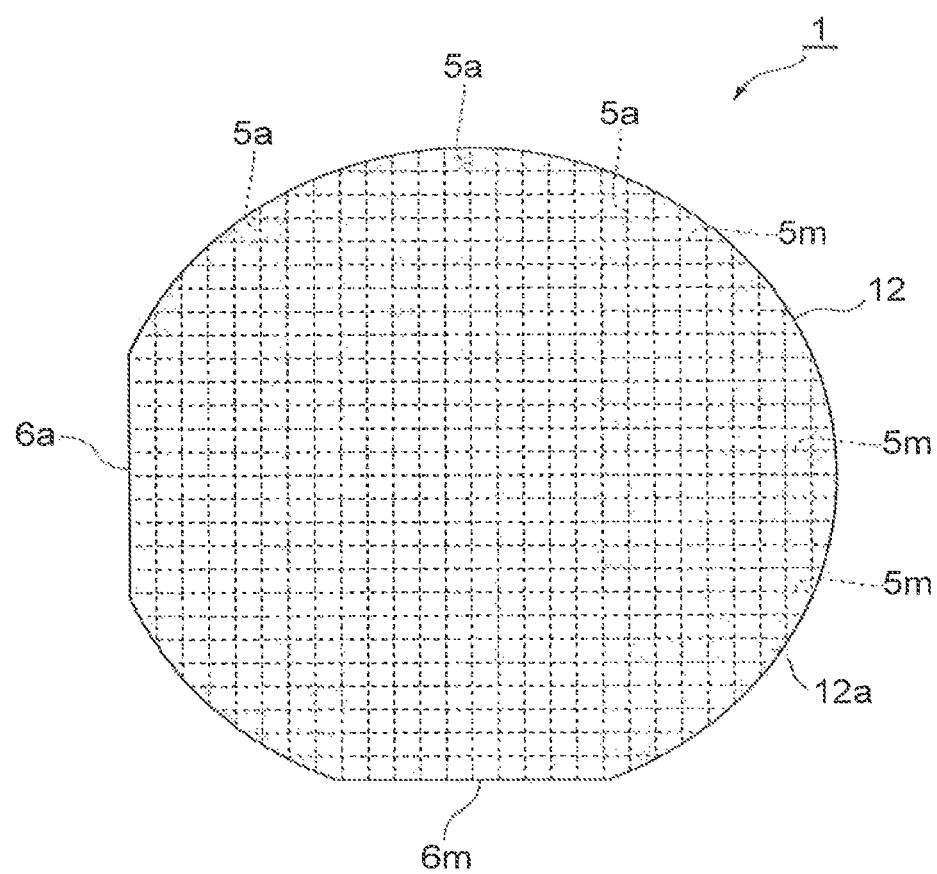
FIG. 7 is a plan view of an object to be processed to which the laser processing method in accordance with an embodiment of the present invention is applied.
Figure 8:
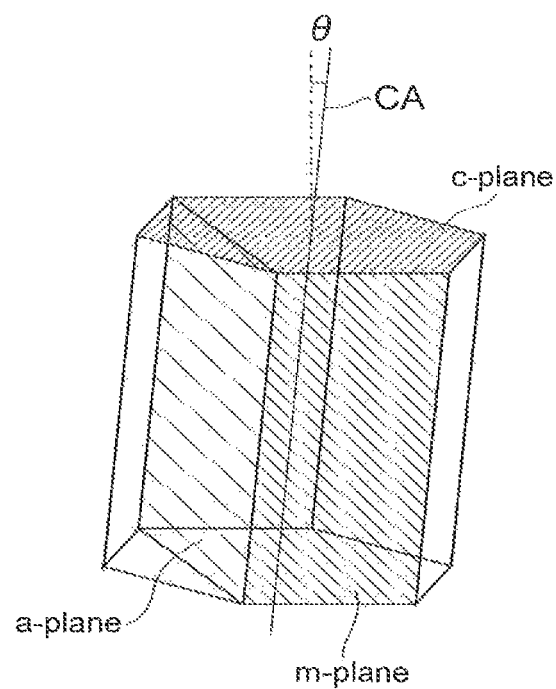
FIG. 8 is a diagram illustrating a crystal structure of the object in FIG. 7.
Figure 9:
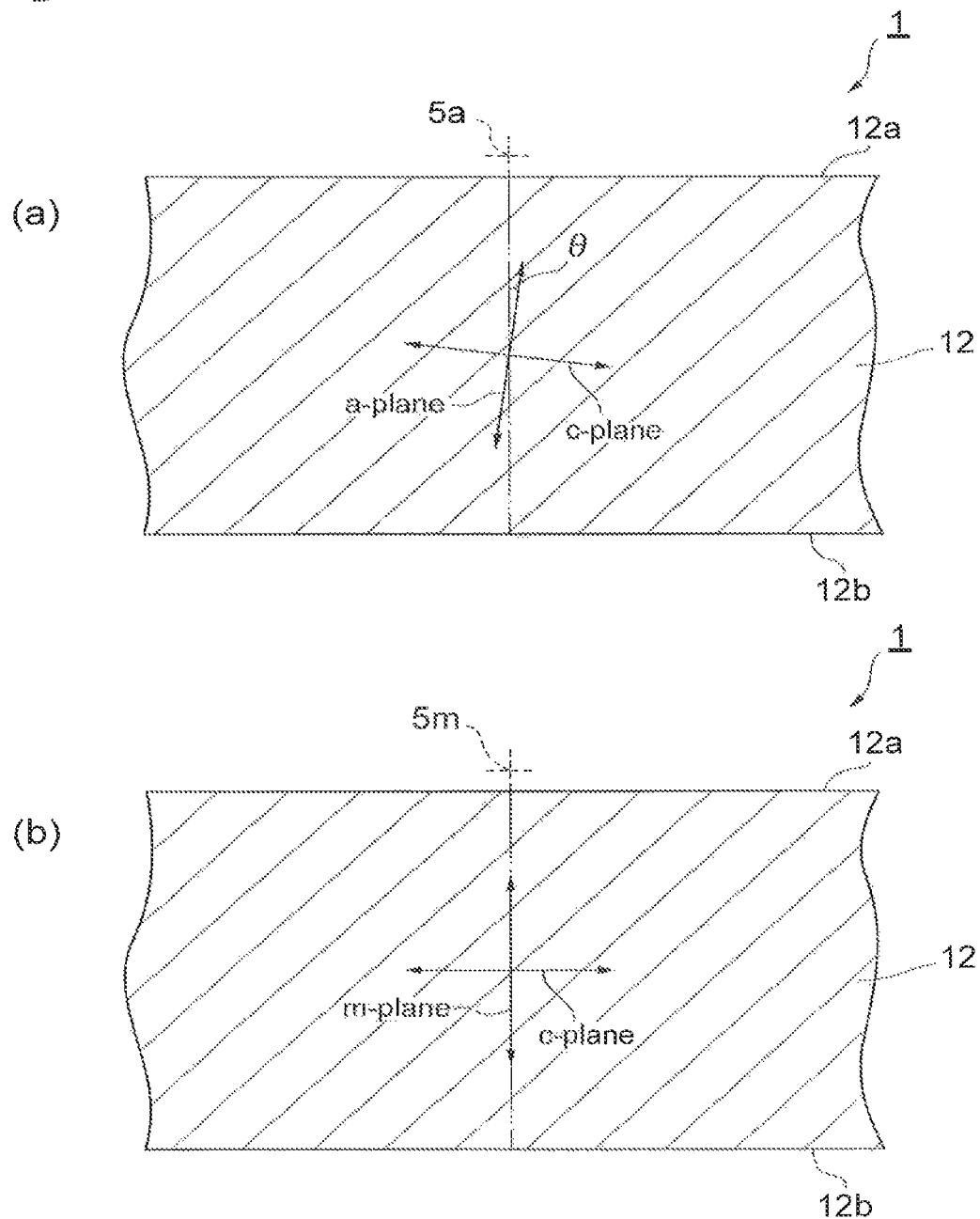
FIG. 9 is a set of partial sectional views of the object in FIG. 7.

The laser processing method in accordance with an embodiment of the present invention will now be explained in detail. As illustrated in FIG. 7, the object 1 is a wafer shaped like a disk (e.g., with a diameter of 3 inches and a thickness of 350 μm) comprising an SiC substrate 12. As illustrated in FIG. 8, the SiC substrate 12 has a hexagonal crystal structure with its crystal axis CA tilting by an angle θ (e.g., 4°) with respect to the thickness direction of the SiC substrate 12. That is, the SiC substrate 12 is a hexagonal SiC substrate having an off-angle equal to the angle θ. As illustrated in FIG. 9, the SiC substrate 12 has a front face (main surface) 12a and a rear face (main surface) 12b which form the angle θ corresponding to the off-angle with a c-plane. The SiC substrate 12 has an a-plane tilted by the angle θ with respect to the thickness direction (dash-double-dot line in the drawing) of the SiC substrate 12 and an m-plane not tilted with respect to the thickness direction of the SiC substrate 12.

As illustrated in FIGS. 7 and 9, a plurality of lines to cut (first lines to cut) 5a extending in a direction parallel to the front face 12a and a-plane and a plurality of lines to cut (second lines to cut) 5m extending in a direction parallel to the a- and m-planes are set like grids (each having a size of 1 mm×1 mm, for example) in the object 1. A functional device is formed in each region defined by the lines 5a, 5m on the front face 12a of the SiC substrate 12, while metal wiring is formed in each region defined by the lines 5a, 5m on the rear face 12a of the SiC substrate 12. The functional device and metal wiring construct a power device in each chip obtained by cutting the object 1 along the lines 5a, 5m. The SiC substrate 12 is formed with orientation flats 6a, 6m in directions parallel to the lines 5a, 5m, respectively.

Figure 10:
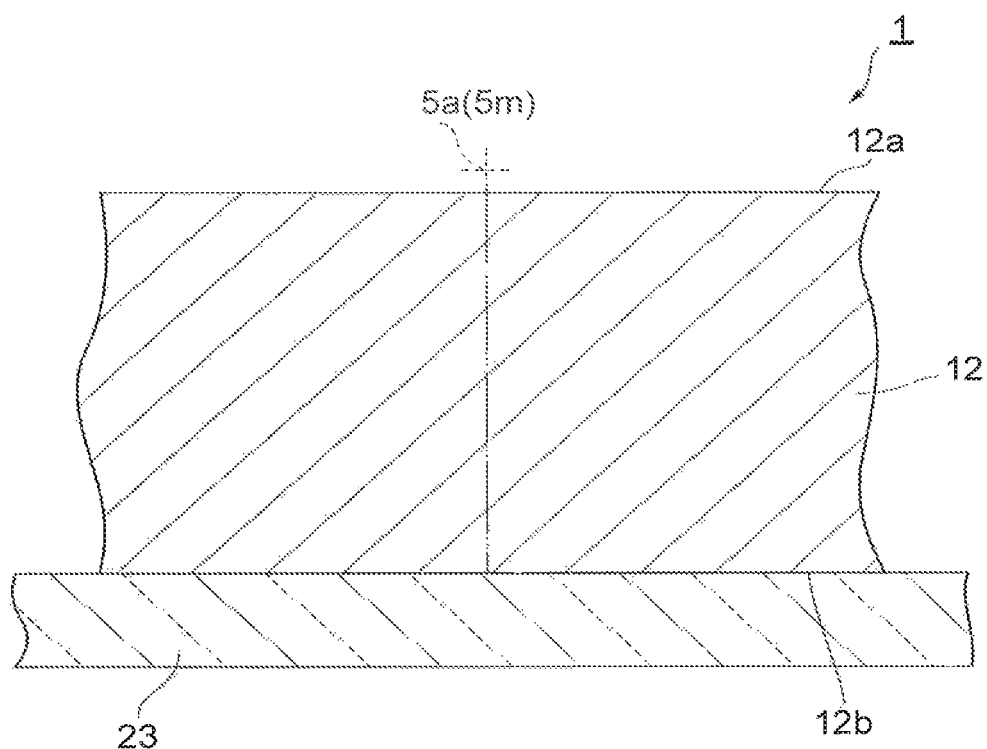
FIG. 10 is a partial sectional view of the object subjected to the laser processing method in accordance with the embodiment of the present invention.
Figure 11:
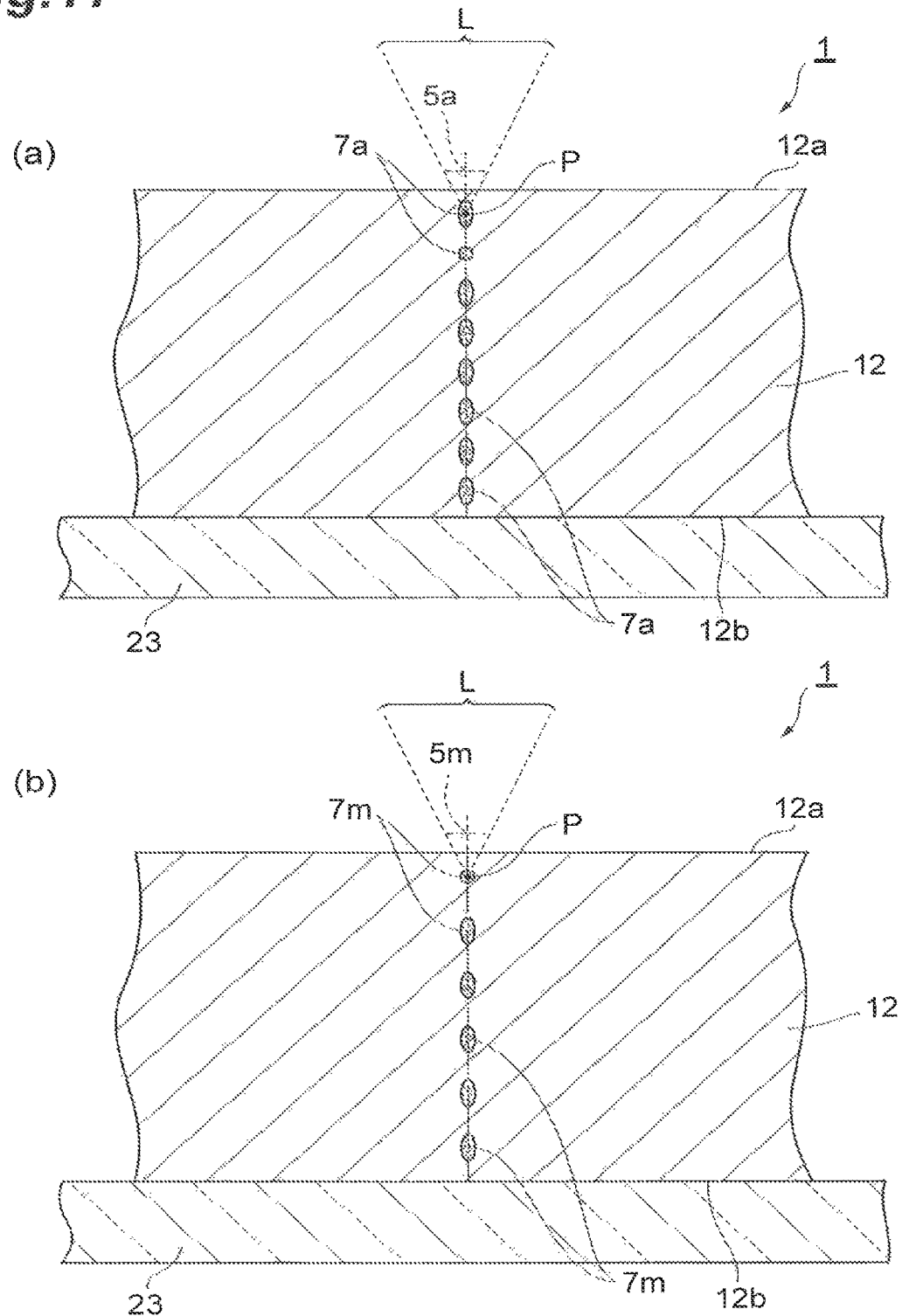
FIG. 11 is a set of partial sectional views of the object subjected to the laser processing method in accordance with the embodiment of the present invention.

The foregoing object 1 is cut along the lines 5a, 5m as follows. First, as illustrated in FIG. 10, an expandable tape 23 is attached to the object 1 so as to cover the metal wiring on the rear face 12b of the SiC substrate 12. Subsequently, as illustrated in FIG. 11(a), the object 1 is irradiated along the line 5a with the laser light L oscillated in a pulsating manner at a pulse width of 20 ns to 100 ns (more preferably 50 ns to 60 ns) such that a pulse pitch becomes 10 μm to 18 μm (more preferably 12 μm to 14 μm), while locating the converging point P of the laser light L within the SiC substrate 12. This forms a modified region (first modified region) 7a to become a cutting start point within the SiC substrate 12 along the line 5a. This modified region 7a includes a molten processed region. The pulse pitch is a value obtained by dividing the moving speed of the converging point P of the laser light L with respect to the object 1 by the repetition frequency of the pulsed laser light L.

More specifically, the modified region 7a is formed by locating the converging point P of the laser light L within the SiC substrate 12, while using the front face 12a of the SiC substrate 12 as a laser light entrance surface, and relatively moving the converging point P along the line 5a. For each line 5, the relative movement of the converging point P along the line 5a is performed a plurality of times (e.g., 8 times). During this operation, a plurality of rows (first rows; e.g., 8 rows) of modified regions 7a aligning with each other in the thickness direction of the SiC substrate 12 are formed with respect to each line 5a by changing the distance from the front face 12a to the position of the converging point P at each time. Here, the modified regions 7a are formed sequentially from the rear face 12b side of the SiC substrate 12 (i.e., in descending order of distance from the laser light entrance surface) such that the modified region 7a second closest to the front face 12a acting as the laser light entrance surface of the SiC substrate 12 is smaller than the modified region 7a closest to the front face 12a. The size of the modified regions 7a can be adjusted by changing the pulse energy of the laser light L, for example.

This makes fractures generated from the modified regions 7a extend in the thickness direction of the SiC substrate 12 and connect with each other. In particular, fractures extending in the thickness direction of the SiC substrate 12 from the modified region 7a closest to the front face 12a acting as the laser light entrance surface of the SiC substrate 12 are made to reach the front face 12a. These are very important for accurately cutting along the line 5a the SiC substrate 12 made of a material which has the second highest hardness behind diamond and thus is hard to process.

After forming the modified regions 7a along the lines 5a, as illustrated in FIG. 11(b), the object 1 is irradiated along the line 5m with the laser light L oscillated in a pulsating manner at a pulse width of 20 ns to 100 ns (more preferably 50 ns to 60 ns) such that a pulse pitch becomes 10 μm to 18 μm (more preferably 12 μm to 14 μm), while locating the converging point P of the laser light L within the SiC substrate 12. This forms a modified region (second modified region) 7m to become a cutting start point within the substrate 12 along the line 5m. This modified region 7m includes a molten processed region.

More specifically, the modified region 7m is formed by locating the converging point P of the laser light L within the SiC substrate 12, while using the front face 12a of the SiC substrate 12 as the laser light entrance surface, and relatively moving the converging point P along the line 5m. For each line 5, the relative movement of the converging point P along the line 5m is performed a plurality of times (e.g., 6 times). During this operation, a plurality of rows (second rows whose number, e.g., 6, is smaller than that of the first rows and may also be 1) of modified regions 7m aligning with each other in the thickness direction of the SiC substrate 12 are formed with respect to each line 5m by changing the distance from the front face 12a to the position of the converging point P at each time. Here, the modified regions 7m are formed sequentially from the rear face 12b side of the SiC substrate 12 (i.e., in descending order of distance from the laser light entrance surface) such that the modified region 7m closest to the front face 12a acting as the laser light entrance surface of the SiC substrate 12 is smaller than the modified region 7m second closest to the front face 12a. The size of the modified regions 7m can be adjusted by changing the pulse energy of the laser light L, for example.

This makes fractures generated from the modified regions 7m extend in the thickness direction of the SiC substrate 12 and connect with each other. In particular, fractures extending in the thickness direction of the SiC substrate 12 from the modified region 7m closest to the front face 12a acting as the laser light entrance surface of the SiC substrate 12 are made to reach the front face 12a. These are very important for accurately cutting along the line 5m the SiC substrate 12 made of a material which has the second highest hardness behind diamond and thus is hard to process.

Figure 12:
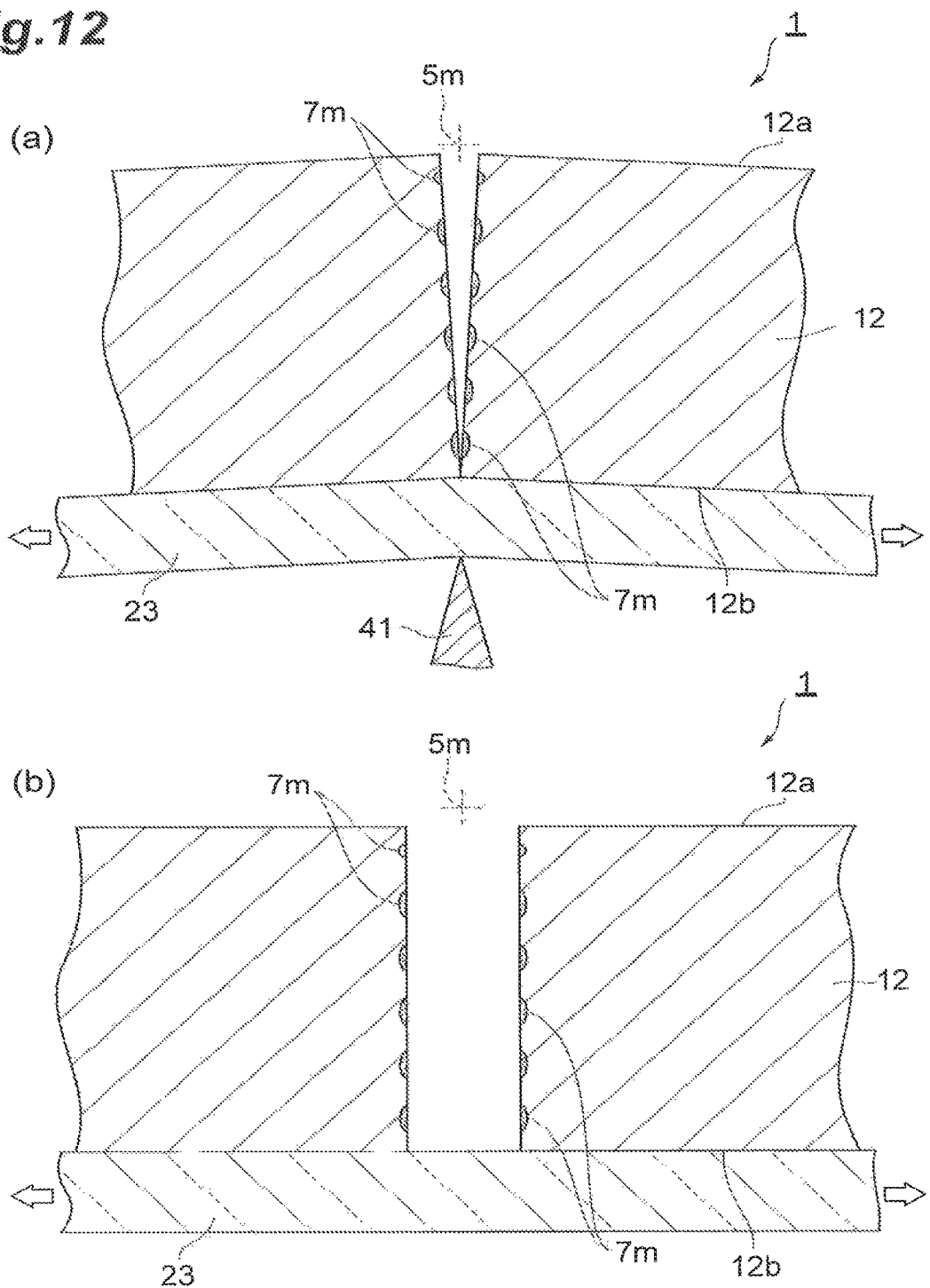
FIG. 12 is a set of partial sectional views of the object subjected to the laser processing method in accordance with the embodiment of the present invention.

After forming the modified regions 7m along the lines 5m, as illustrated in FIG. 12(a), the expandable tape 23 is expanded and, while in this state, a knife edge 41 is pressed against the rear face 12b of the SiC substrate 12 along each line 5m through the expandable tape 23. This cuts the object 1 into bars along the lines 5m from the modified regions 7m acting as cutting start points. At this time, the expandable tape 23 is in the expanded state, whereby the bars of the object 1 are separated from each other as illustrated in FIG. 12(b).

Figure 13:
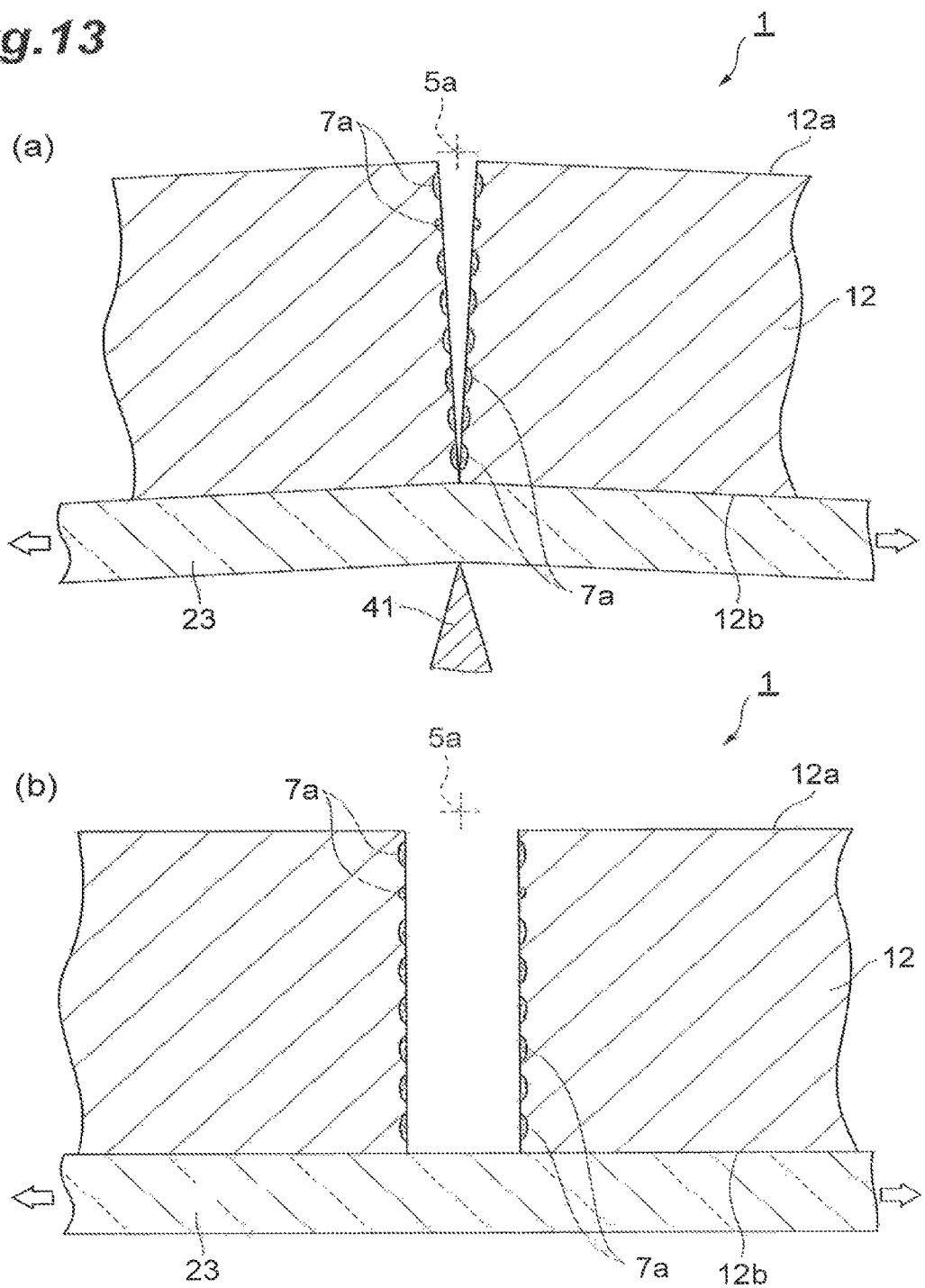
FIG. 13 is a set of partial sectional views of the object subjected to the laser processing method in accordance with the embodiment of the present invention.

After cutting the object 1 along the lines 5m, while the expandable tape 23 is still in the expanded state, the knife edge 41 is pressed against the rear face 12b of the SiC substrate 12 along each line 5a through the expandable tape 23 as illustrated in FIG. 13(a). This cuts the object 1 into chips along the lines 5a from the modified regions 7a acting as cutting start points. At this time, the expandable tape 23 is in the expanded state, whereby the chips of the object 1 are separated from each other as illustrated in FIG. 13(b). As in the foregoing, the object 1 is cut into chips along the lines 5a, 5m, so as to yield a number of power devices.

Because of the following reasons, the foregoing laser processing method can accurately cut along the lines 5a, 5m the planar object 1 comprising the hexagonal SiC substrate 12 having the front face 12a forming an angle corresponding to the off-angle with the c-plane, thereby yielding pieces of the object 1 (i.e., power devices) precisely cut along the lines 5a, 5m.

First, the object 1 is irradiated with the laser light L along the lines 5a, 5m such that the pulse pitch becomes 10 μm to 18 μm. Irradiating the object 1 with the laser light L under such a condition can make fractures extend from the modified regions 7a, 7m easier in the thickness direction of the SiC substrate 12 but harder in the c-plane direction. Irradiating the object 1 with the laser light L such as to yield a pulse pitch of 12 μm to 14 μm can make fractures extend from the modified regions 7a, 7m further easier in the thickness direction of the SiC substrate 12 but further harder in the c-plane direction.

The laser light L is pulse-oscillated at a pulse width of 20 ns to 100 ns. This can securely make fractures extend from the modified regions 7a, 7m easier in the thickness direction of the SiC substrate 12 but harder in the c-plane direction. Pulse-oscillating the laser light L at a pulse width of 50 ns to 60 ns can more securely make fractures extend from the modified regions 7a, 7m easier in the thickness direction of the SiC substrate 12 but harder in the c-plane direction.

Along the line 5a, the modified region 7a second closest to the front face 12a acting as the laser light entrance surface of the SiC substrate 12 is formed relatively small. This can prevent, even when the a-plane is tilted with respect to the thickness direction of the SiC substrate 12, fractures generated from the modified region 7a second closest to the front face 12a from extending in the a-plane direction and reaching the front face 12a while greatly deviating from the line 5a. Along the line 5a, the modified region 7a closest to the front face 12a acting as the laser light entrance surface of the SiC substrate 12 is formed relatively large. This can securely make fractures reach the front face 12a from the modified region 7a closest to the front face 12a but hard to extend in the thickness direction of the SiC substrate 12 from the modified regions 7a. Along the line 5m, the modified region 7m second closest to the front face 12a acting as the laser light entrance surface of the SiC substrate 12 is formed relatively large. This, coupled with the fact that fractures are easy to extend in the thickness direction of the SiC substrate 12 from the modified regions 7m, can make fractures generated from the modified region 7m second closest to the front face 12a reach the front face 12a or nearby. Along the line 5m, the modified region 7a closest to the front face 12a acting as the laser light entrance surface of the SiC substrate 12 is formed relatively small. This can make fractures securely reach the front face 12a from the modified region 7m, while preventing the front face 12a from being damaged. As in the foregoing, fractures can securely reach the front face 12a from the modified regions 7a, 7m along the lines 5a, 7m, respectively. This effect is exhibited independently of but more remarkably in concordance with numbers of rows and order of modified regions 7a, 7m which will be explained later.

A greater number of rows of modified regions 7a are formed along each line 5a than that of modified regions 7m formed along each line 5m. This can make fractures easier to connect in the thickness direction of the SiC substrate 12 between all the modified regions 7a while preventing them from extending greatly in the a-plane direction from the modified regions 7a when forming each modified region 7a even if the a-plane is tilted with respect to the thickness direction of the SiC substrate 12. A smaller number of rows of modified regions 7m are formed along each line 5m than those of modified regions 7a formed along each line 5a. This can make fractures greatly extend in the thickness direction of the SiC substrate 12 from the modified regions 7m when forming each modified region 7m. As in the foregoing, fractures can extend in the thickness direction of the SiC substrate 12 from the modified regions 7a, 7m along the lines 5a, 5m, respectively. This effect is exhibited independently of but more remarkably in concordance with the above-mentioned sizes by which the modified regions 7a, 7m are formed and the order of forming them that will be explained later.

Before forming the modified regions 7m having a moderate condition for extending fractures in the thickness direction of the SiC substrate 12, the modified regions 7a having a severe condition for extending fractures in the thickness direction of the SiC substrate 12 are formed. This can prevent the modified regions 7m from inhibiting fractures from extending in the thickness direction of the SiC substrate 12 from the modified regions 7a in parts where the lines 5a, 5m intersect when forming the modified regions 7a. This effect is exhibited independently of the above-mentioned sizes and numbers of rows by which the modified regions 7a, 7m are formed.

Further, the object 1 is cut along the lines 5m from the modified regions 7m acting as start points and then along the lines 5a from the modified regions 7a acting as start points. This cuts the object 1 along the lines 5m that are assumed to be relatively hard to cut because of a smaller number of rows of the modified regions 7m formed and then along the modified regions 5a that are assumed to be relatively easy to cut because of a greater number of rows of the modified regions 7a formed. As a consequence, the force required for cutting the object 1 along the lines 5m and the force required for cutting the object 1 along the lines 5a can be made on a par with each other, whereby the accuracy in cutting can further be improved along both of the lines 5m, 5a. This effect is exhibited independently of the above-mentioned sizes and numbers of rows by which the modified regions 7a, 7m are formed.

Figure 14:
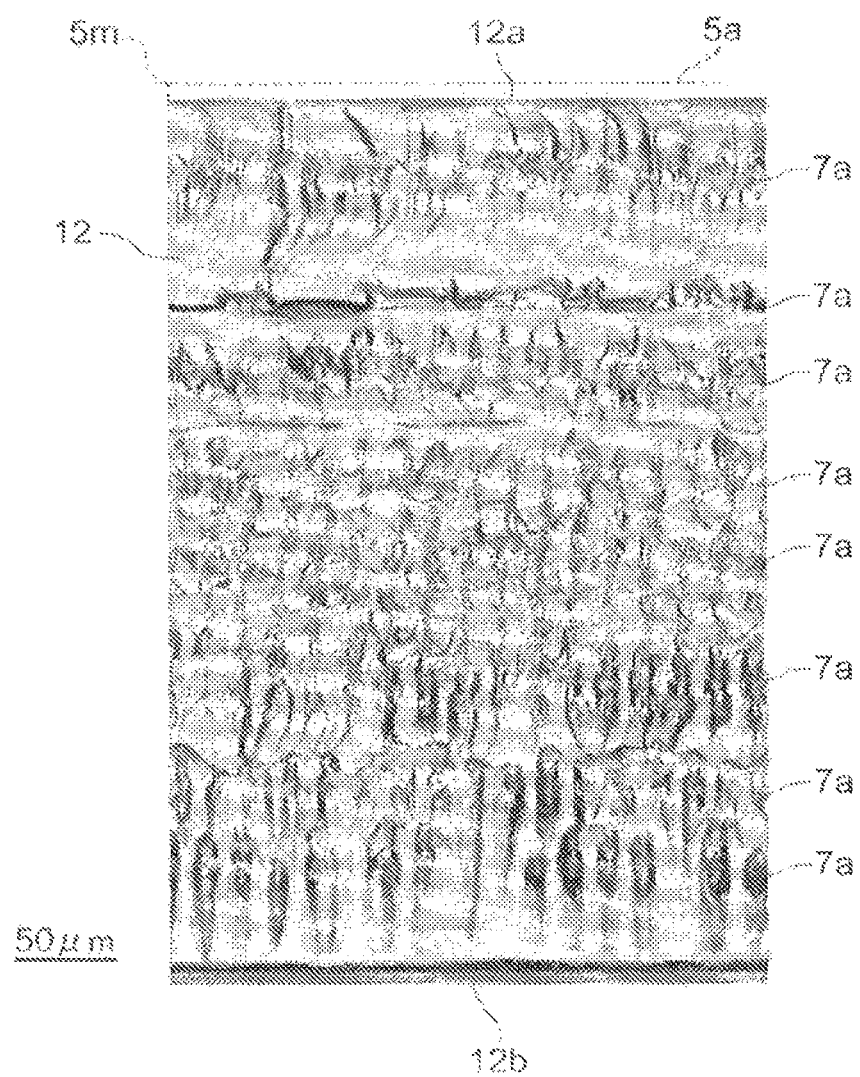
FIG. 14 is a diagram illustrating a photograph of a cross section of an SiC substrate cut by the laser processing method in accordance with the embodiment of the present invention.
Figure 15:
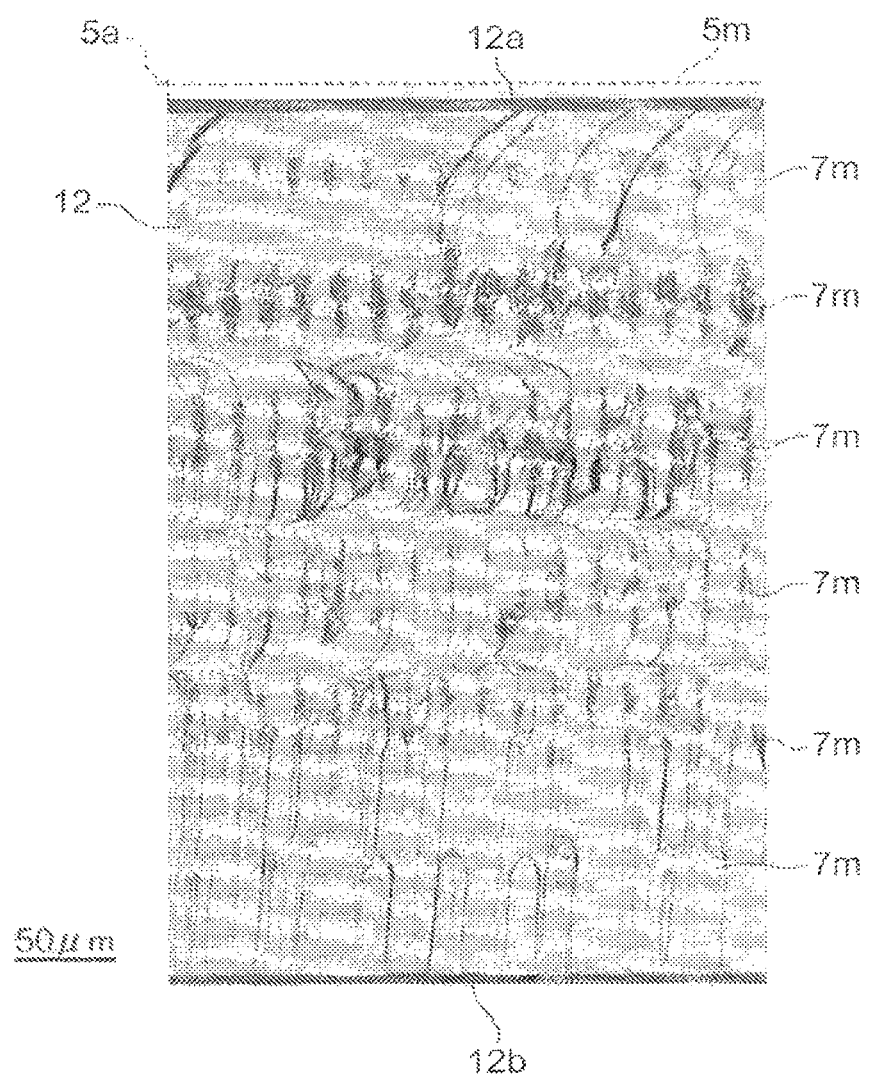
FIG. 15 is a diagram illustrating a photograph of a cross section of the SiC substrate cut by the laser processing method in accordance with the embodiment of the present invention.
Figure 16:
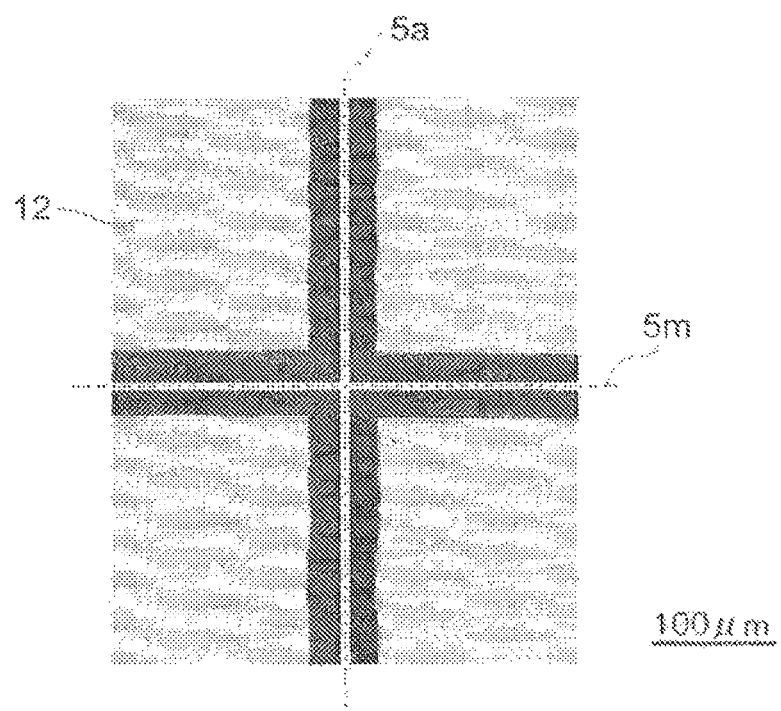
FIG. 16 is a diagram illustrating a plan view photograph of the SiC substrate cut by the laser processing method in accordance with the embodiment of the present invention.

FIG. 14 is a diagram illustrating a photograph of a cross section of the SiC substrate 12 cut along the line 5a by the above-mentioned laser processing method. FIG. 15 is a diagram illustrating a photograph of a cross section of the SiC substrate 12 cut along the line 5m by the above-mentioned laser processing method. FIG. 16 is a diagram illustrating a plan view photograph of the SiC substrate 12 cut along the lines 5a, 5m by the above-mentioned laser processing method. Here, the hexagonal SiC substrate 12 having a thickness of 350 μm with an off-angle of 4° was prepared.

First, as illustrated in FIG. 14, 8 rows of modified regions 7a aligning with each other in the thickness direction of the SiC substrate 12 were formed for each line 5a along the lines 5a. The modified regions 7a were formed sequentially from the rear face 12b side of the SiC substrate 12 such that the modified region 7a second closest to the front face 12a acting as the laser light entrance surface of the SiC substrate 12 was smaller than the modified region 7a closest to the front face 12a. It is seen from FIG. 14 that the forming of the modified region 7a second closest to the front face 12a stops fractures generated from the modified regions 7a from extending. As a result, the meandering of cut surfaces with respect to the lines 5a was suppressed to ±4 μm or less as illustrated in FIG. 16.

The distance from the front face 12a to the position of the converging point P is 314.5 μm, 280.0 μm, 246.0 μm, 212.0 μm, 171.5 μm, 123.5 μm, 79.0 μm, and 32.0 μm sequentially from the modified region 7a on the rear face 12b side of the SiC substrate 12. The pulse energy of the laser light L is 25 μJ, 25 μJ, 25 μJ, 25 μJ, 20 μJ, 15 μJ, 6 μJ, and 6 μJ sequentially from the modified region 7a on the rear face 12b side of the SiC substrate 12.

Along the lines 5m, as illustrated in FIG. 15, 6 rows of modified regions 7m aligning with each other in the thickness direction of the SiC substrate 12 were formed for each line 5m. The modified regions 7m were formed sequentially from the rear face 12b side of the SiC substrate 12 such that the modified region 7m closest to the front face 12a acting as the laser light entrance surface of the SiC substrate 12 was smaller than the modified region 7m second closest to the front face 12a. It is seen from FIG. 15 that the forming of the modified region 7a second closest to the front face 12a makes fractures generated from the modified regions 7a extend to the front face 12a or nearby. As a result, the meandering of cut surfaces with respect to the lines 5a was suppressed to ±2 μm or less as illustrated in FIG. 16.

The distance from the front face 12a to the position of the converging point P is 315.5 μm, 264.5 μm, 213.5 μm, 155.0 μm, 95.5 μm, and 34.5 μm sequentially from the modified region 7m on the rear face 12b side of the SiC substrate 12. The pulse energy of the laser light L is 25 μJ, 25 μJ, 20 μJ, 20 μJ, 15 μJ, and 7 μJ sequentially from the modified region 7m on the rear face 12b side of the SiC substrate 12.

Figure 17:
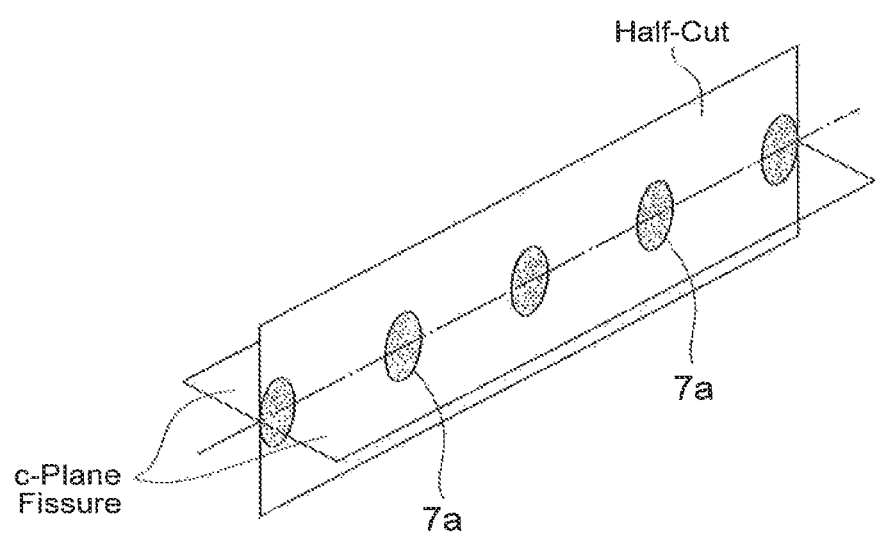
FIG. 17 is a perspective view for explaining c-plane fissures occurring within the SiC substrate.
Figure 18:
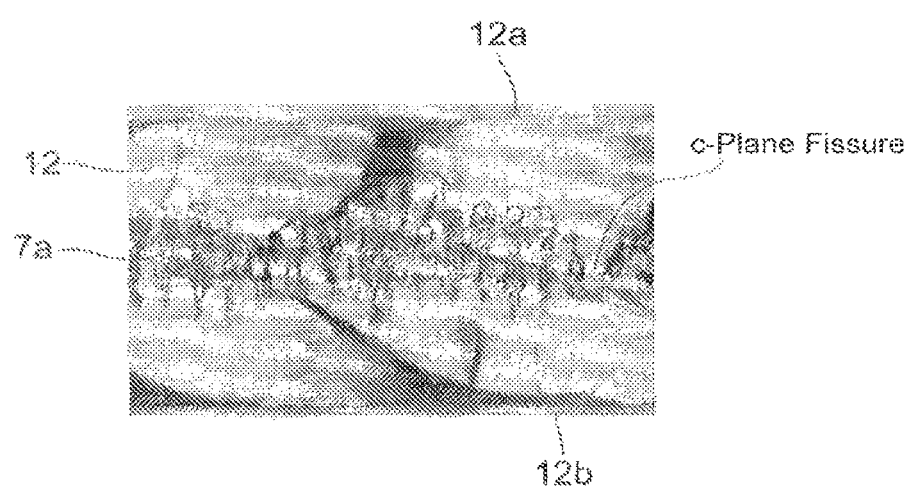
FIG. 18 is a diagram illustrating a photograph of a cut plane of the SiC substrate in which the c-plane fissure is generated.

Relationships between fractures (hereinafter referred to as "half-cuts") reaching the front face 12a acting as the laser light entrance surface of the SiC substrate 12 from the modified regions 7a, 7m and fractures (hereinafter referred to as "c-plane fissures") extending in the c-plane direction from the modified regions 7a, 7m will now be explained. Here, as illustrated in FIGS. 17 and 18, the explanation will focus on the modified regions 7a harder to generate the half-cuts but easier to generate the c-plane fissures than the modified regions 7m.

FIG. 19 is a table illustrating relationships between pulse width and ID threshold, HC threshold, and processing margin. Here, while changing the pulse width at 1 ns and within the range of 10 ns to 120 ns, the ID threshold, HC threshold, and processing margin were evaluated for each pulse width. FIG. 20 is a table illustrating relationships between pulse pitch and ID threshold, HC threshold, and processing margin. Here, while changing the pulse pitch within the range of 6 μm to 22 μm, the threshold, HC threshold, and processing margin were evaluated for each pulse pitch.

The ID threshold is the smallest value of pulse energy of the laser light that can generate the c-plane fissure and was evaluated excellent, good, fair, and poor in descending order (i.e., in descending order of hardness to generate the c-plane fissure). The HC threshold is the smallest value of pulse energy of the laser light that can generate the half-cut and was evaluated excellent, good, fair, and poor in ascending order (i.e., in descending order of easiness to generate the half-cut). The processing margin is the difference between the ID and HC thresholds and was evaluated excellent, good, fair, and poor in descending order. The total was weighted by the ID threshold, HC threshold, and processing margin in descending order of priority and evaluated excellent, good, fair, and poor.

It is seen from the results that, as illustrated in FIG. 19, the laser light L is preferably pulse-oscillated at a pulse width of 20 ns to 100 ns, more preferably 50 ns to 60 ns. This can promote the generation of half-cuts while inhibiting the c-plane fissures from occurring. The ID threshold, processing margin, and total at the pulse width of 10 ns were evaluated fair but closer to poor than those at the pulse width of 20 ns.

It has also been seen that, as illustrated in FIG. 20, the SiC substrate 12 is preferably irradiated with the laser light L along the lines 5a, 5m such that the pulse pitch becomes 10 μm to 18 μm, more preferably 11 μm to 15 μm, further preferably 12 μm to 14 μm. This can promote the generation of half-cuts while inhibiting the c-plane fissures from occurring. Since the ID threshold is evaluated fair when the pulse pitch is 10 μm, the pulse pitch is more preferably greater than 10 µm if greater importance is given to the suppression of the c-plane fissure generation.

Figure 22:
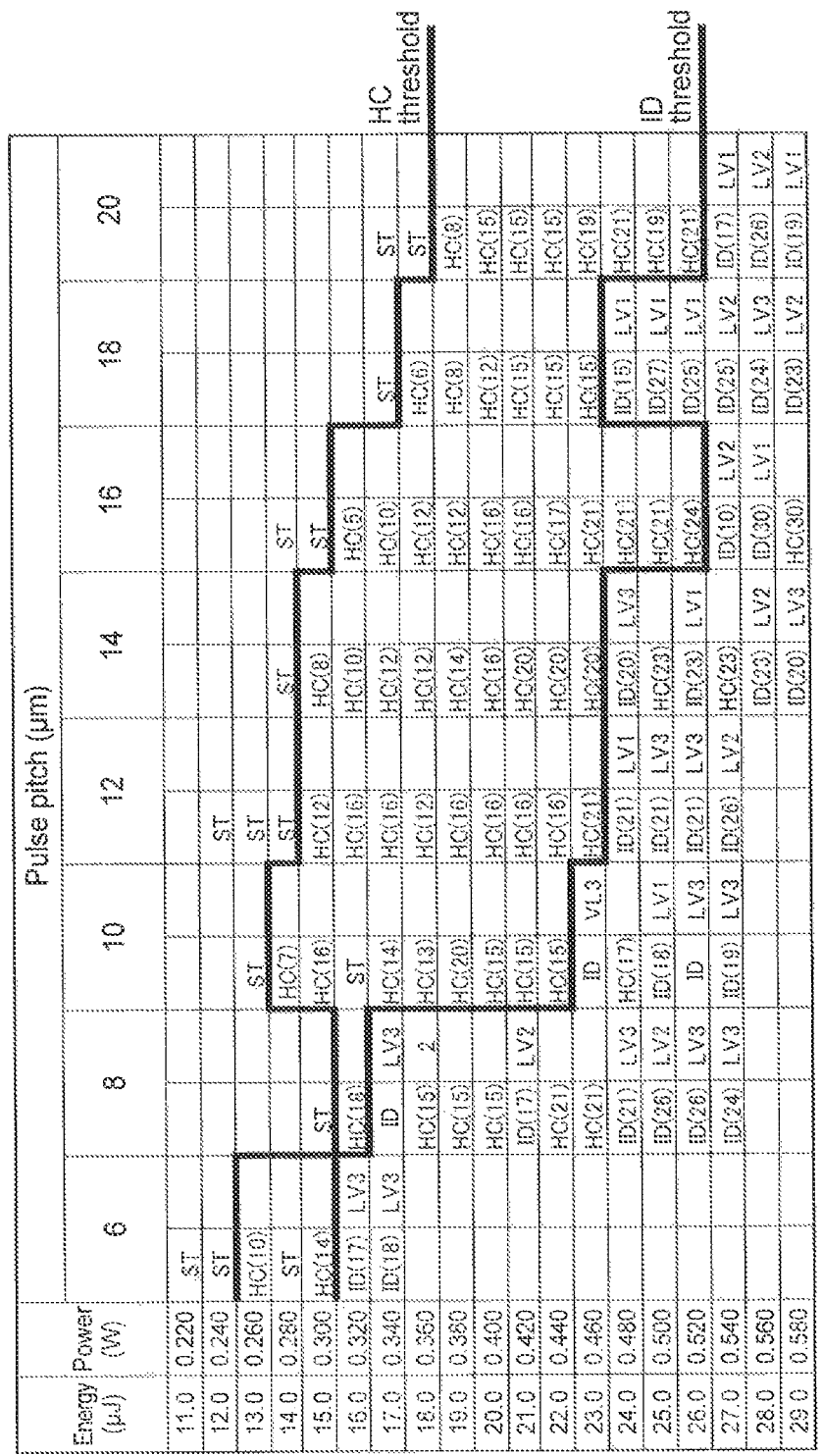
FIG. 22 is a table illustrating results of experiments concerning processing margin with respect to pulse width and pulse pitch.
Figure 23:
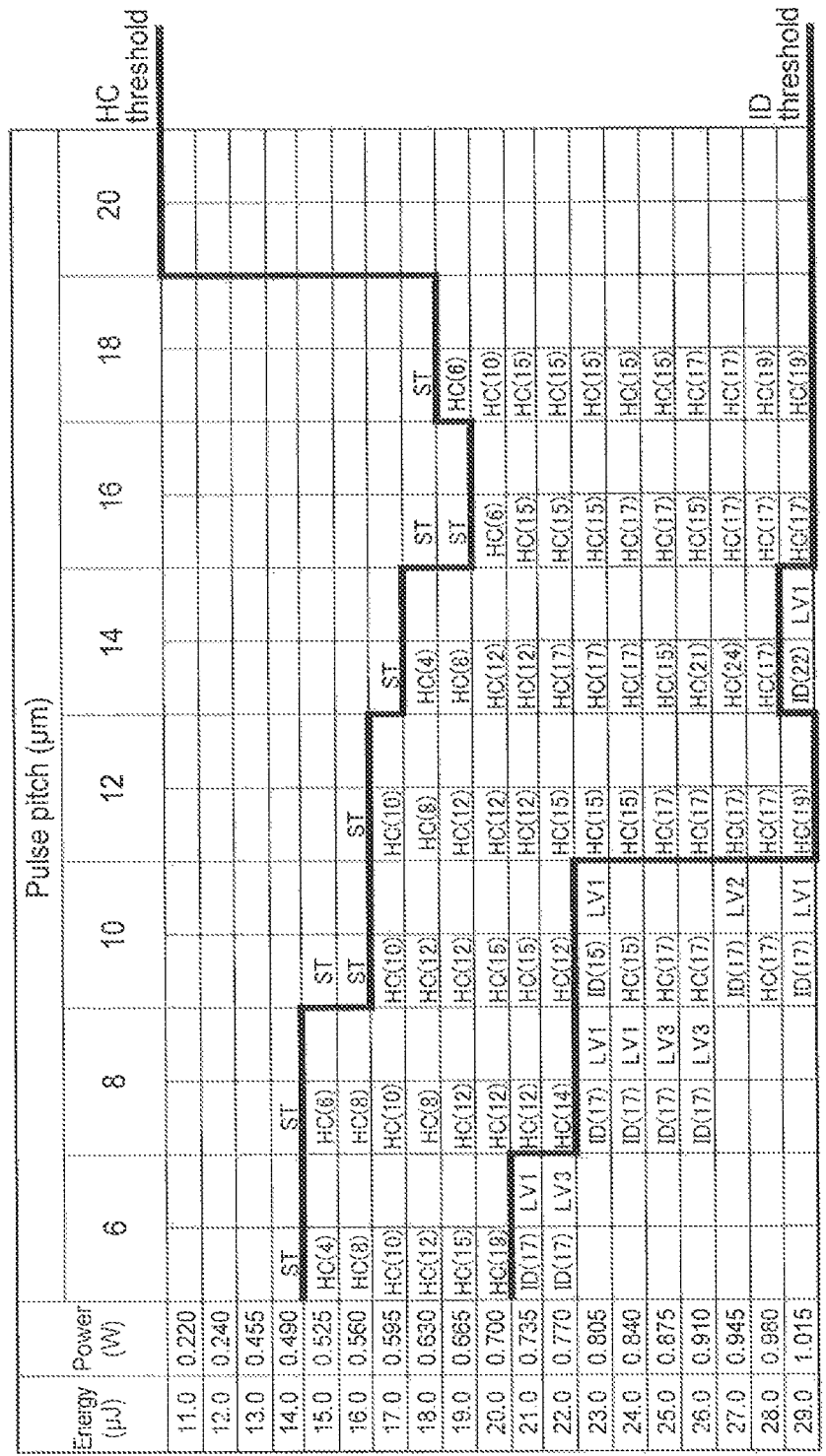
FIG. 23 is a table illustrating results of experiments concerning processing margin with respect to pulse width and pulse pitch.

FIGS. 21 to 23 are tables illustrating results of experiments concerning processing margin with respect to pulse width and pulse pitch in the case where the laser light L is converged at a numerical aperture of 0.8. These results of experiments form grounds for the evaluations illustrated in FIGS. 19 and 20. Conditions under which the results of experiments of FIGS. 21 to 23 were obtained are as follows. First, using the hexagonal SiC substrate 12 having an off-angle of 4° with a thickness of 100 µm as a subject, the converging point P of the laser light L was moved along the line 5a extending in a direction parallel to the front face 12a and a-plane. On the other hand, the laser light L was converged at a numerical aperture of 0.8, and the converging point P was located at a distance of 59 µm from the front face 12a acting as the laser light entrance surface of the SiC substrate 12.

Based on the foregoing conditions of experiments, the modified regions 7a and states of half-cuts and c-plane fissures were observed while changing the energy (pulse energy) and power of the laser light L and the pulse pitch of the laser light L. In FIGS. 21 to 23, the pulse width of the laser light L was 27 ns, 40 ns, and 57 ns, respectively, while the pulse width (repetition frequency) of the laser light L was 10 kHz, 20 kHz, and 35 kHz, respectively.

In the results of experiments in FIGS. 21 to 23, ST and HC indicate that the half-cut occurred and not, respectively. ID indicates that the c-plane fissure occurred, while LV1 to LV3 represent scales on which the c-plane fissure occurred. LV1, LV2, and LV3 refer to the respective cases where the span in which the c-plane fissure occurred was less than 150 µm, less than 450 µm, and 450 µm or more with respect to a span of 40 µm (span of 20 µm×2) when the modified region 7a was formed along each of two lines 5a. The extension of the c-plan fissure in a direction perpendicular to the line 5a was 10 µm to 20 µm in LV but up to about 100 µm in LV2, LV3.

Figure 24:
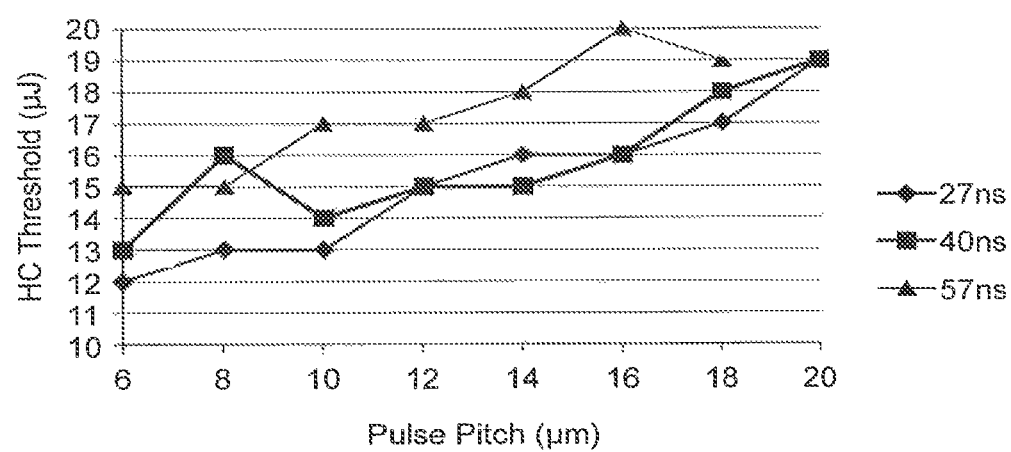
FIG. 24 is a graph illustrating relationships between pulse pitch and HC threshold.
Figure 25:
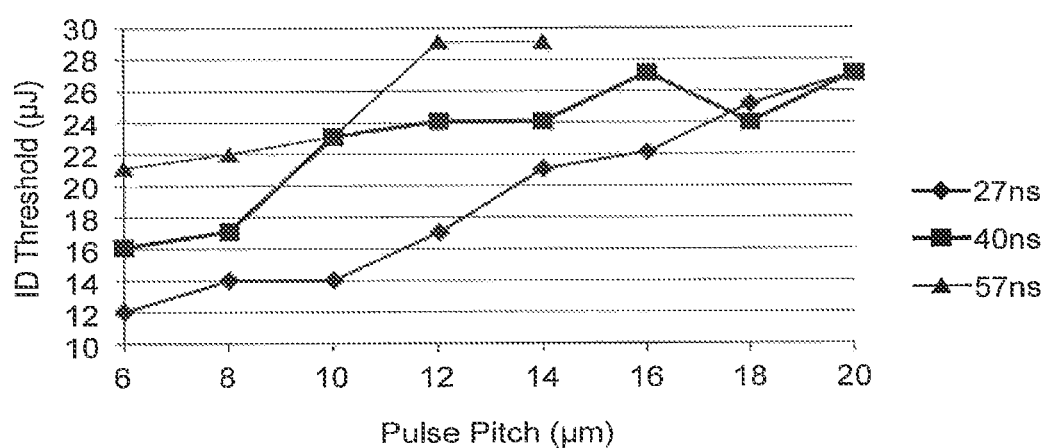
FIG. 25 is a graph illustrating relationships between pulse pitch and ID threshold.
Figure 26:
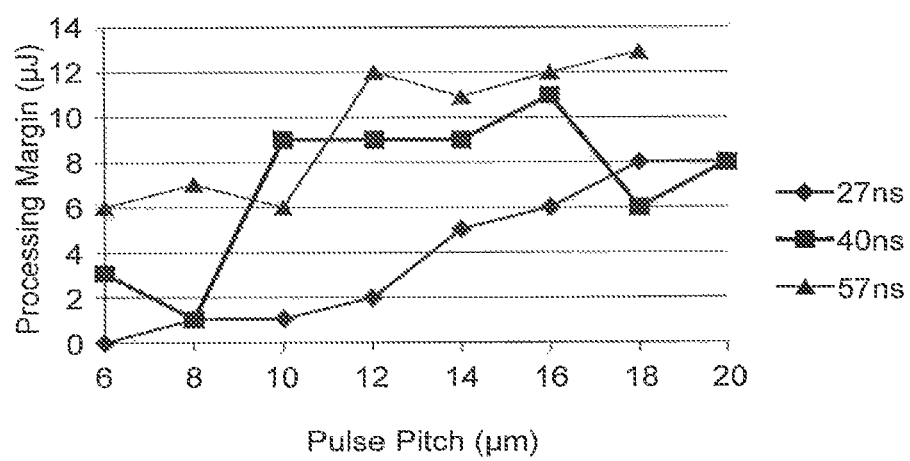
FIG. 26 is a graph illustrating relationships between pulse pitch and processing margin.

FIG. 24 is a graph illustrating relationships between pulse pitch and HC threshold. FIG. 25 is a graph illustrating relationships between pulse pitch and ID threshold. FIG. 26 is a graph illustrating relationships between pulse pitch and processing margin. These graphs were prepared according to the results of experiments of FIGS. 21 to 23. As illustrated in FIGS. 24 and 25, while both of the HC and ID thresholds increase as the pulse width is greater, the improvement (increase) in the HC threshold is greater than the deterioration (increase) in the HC threshold. This means that, as illustrated in FIG. 26, the processing margin becomes greater as the pulse width is larger. When attention is drawn to the pulse widths of 27 ns and 57 ns, for example, at the pulse pitch of 12 µm, the HC threshold deteriorates (increases) by 2 µJ from 15 µJ to 17 µJ, while the ID threshold improves (increases) by 12 µJ from 17 µJ to 29 µJ. The processing margin is seen to improve greatly within the range of pulse pitch of 10 µm to 16 µm at the pulse width of 40 ns over that at the pulse width of 27 ns. The processing margin is seen to improve greatly within the range of pulse pitch of 6 µm to 20 µm at the pulse width of 57 ns over that at the pulse width of 27 ns.

Figure 29:
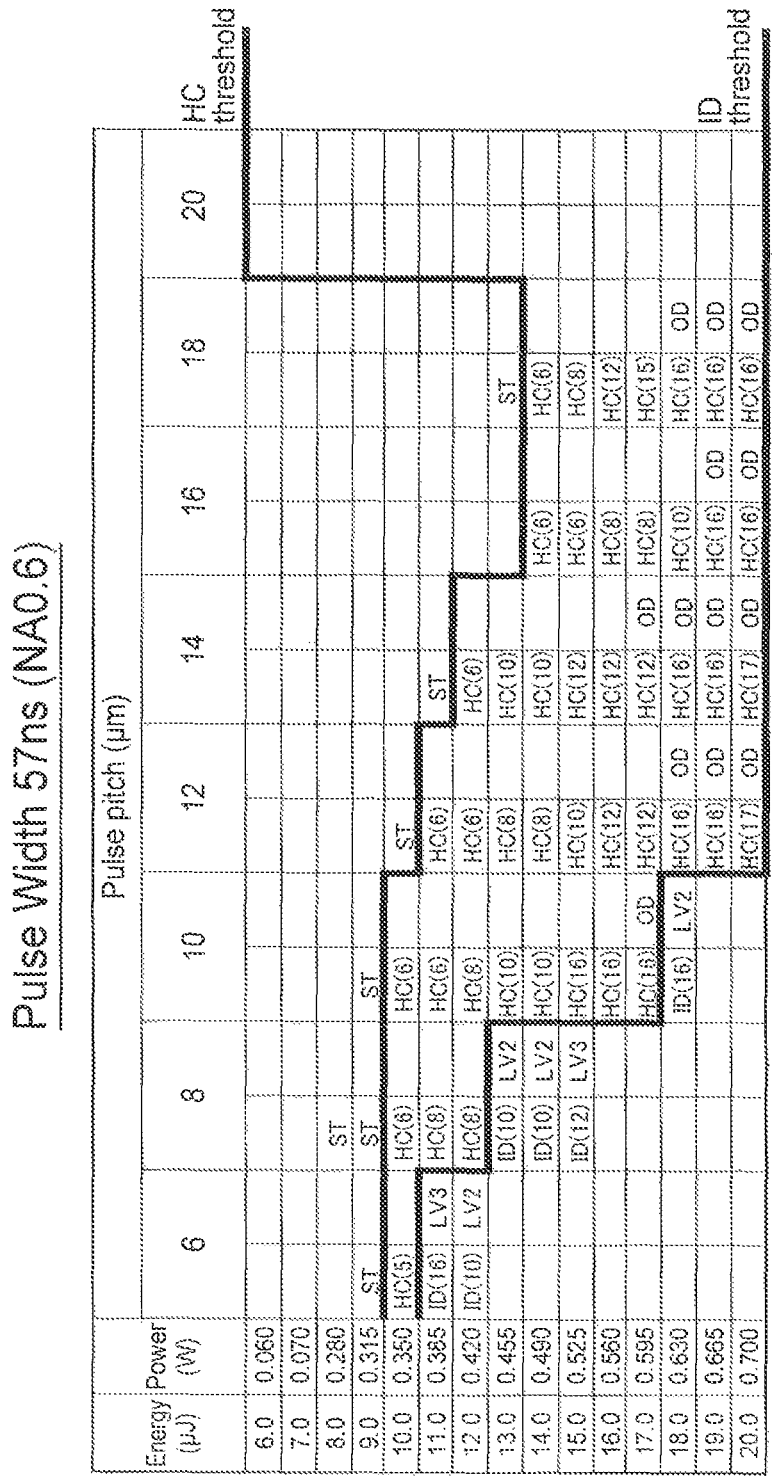
FIG. 29 is a table illustrating results of experiments concerning processing margin with respect to pulse width and pulse pitch.

FIGS. 27 to 29 are tables illustrating results of experiments concerning processing margin with respect to pulse width and pulse pitch in the case where the laser light L is converged at a numerical aperture of 0.6. These results of experiments form grounds for the evaluations illustrated in FIGS. 19 and 20. Conditions under which the results of experiments of FIGS. 27 to 29 were obtained are as follows. First, using the hexagonal SiC substrate 12 having a thickness of 350 µm with the front face 12a forming an angle corresponding to the off-angle with the c-plane as a subject, the converging point P of the laser light L was moved along the line 5a extending in a direction parallel to the front face 12a and a-plane. On the other hand, the laser light L was converged at a numerical aperture of 0.6, and the converging point P was located at a distance of 50 µm from the front face 12a acting as the laser light entrance surface of the SiC substrate 12.

Based on the foregoing conditions of experiments, the modified regions 7a and states of half-cuts and c-plane fissures were observed while changing the energy (pulse energy) and power of the laser light L and the pulse pitch of the laser light L. In FIGS. 27 to 29, the pulse width of the laser light L was 27 ns, 40 ns, and 57 ns, respectively, while the pulse width (repetition frequency) of the laser light L was 10 kHz, 20 kHz, and 35 kHz, respectively.

In the results of experiments in FIGS. 27 to 29, ST and HC indicate that the half-cut occurred and not, respectively. ID indicates that the c-plane fissure occurred, while LV1 to LV3 represent scales on which the c-plane fissure occurred. The standards for LV1 to LV3 are the same as those for the above-mentioned results of experiments of FIGS. 21 to 23. Further, OD indicates that, when the energy of the laser light L was made greater, the modified region 7a also increased, thereby causing fractures to run wild and reach the front face 12a of the SiC substrate 12 while deviating much from the line 5a. In this case, the c-plane fissure was not evaluated. At the pulse widths of 40 ns and 57 ns, however, the c-plane fissure did not occur on a large scale at the pulse pitch of 12 µm or greater.

Figure 30:
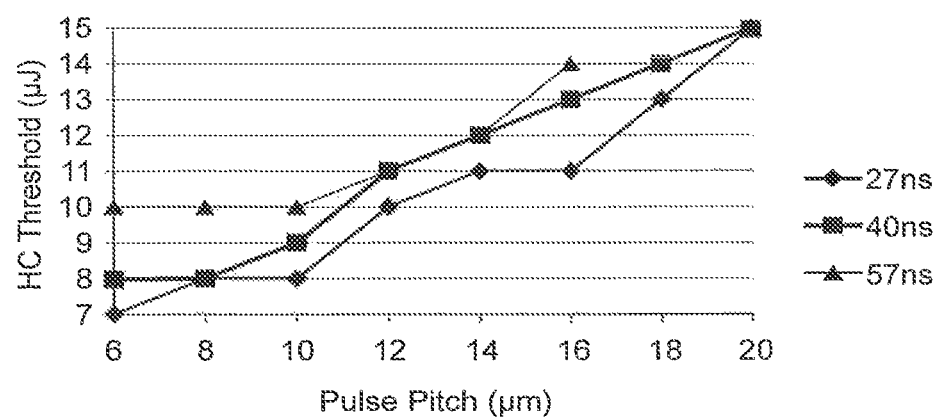
FIG. 30 is a graph illustrating relationships between pulse pitch and HC threshold.

FIG. 30 is a graph illustrating relationships between pulse pitch and HC threshold. This graph was prepared according to the results of experiments of FIGS. 27 to 29. As illustrated in FIG. 30, the HC threshold was harder to occur by about 2 µJ to 4 µJ at the pulse width of 57 ns as compared with that at the pulse width of 40 ns. Aberrations are less influential on the converging point P of the laser light at the numerical aperture of 0.6 than at the above-mentioned numerical aperture of 0.8, whereby about the same HC threshold was obtained at the pulse widths of 57 ns and 40 ns. Therefore, it can be said that, even when the pulse width is large (up to at least 60 ns), the HC threshold will not deteriorate if the aberrations are corrected.

Results of experiments concerning processing margin with respect to HC quality in the vicinity of the front face 12a acting as the laser light entrance surface of the SiC substrate 12 will now be explained. Conditions under which the results of experiments of FIGS. 31 to 33 were obtained are as follows. First, using the hexagonal SiC substrate 12 having an off-angle of 4° with a thickness of 100 µm as a subject, the converging point P of the laser light L was moved along the line 5a extending in a direction parallel to the front face 12a and a-plane. On the other hand, the laser light L was converged at a numerical aperture of 0.8.

First, in the results of experiments in FIG. 31, under the irradiation with the laser light L at each of pulse widths of 27 ns, 40 ns, 50 ns, and 57 ns, respective energies (pulse energies) generating a half-cut and not at a converging point position of 40.6 µm were used, and the state of half-cuts was observed while changing the converging point position within the range of 25.3 µm to 40.6 µm. The pulse pitch of the laser light L was fixed at 14 µm. Here, the converging point position is the distance from the front face 12a to the position of the converging point P. As a result, the quality of half-cuts hardly deteriorated depending on the pulse width, so that high-quality half-cuts (incurring less meandering with respect to lines to cut) were generated at the pulse width of 27 ns to 57 ns. The processing margin increased as the pulse width was greater. When the pulse width was small, branching and fissures (OD) were likely to occur in a part of half-cuts.

In the results of experiments in FIG. 32, under the irradiation with the laser light L at each of pulse widths of 27 ns, 40 ns, 50 ns, and 57 ns, the state of half-cuts was observed while changing the pulse energy within the range of 7 µJ to 12 µJ. The pulse pitch of the laser light L was fixed at 14 µm, while the converging point position was fixed at 34.5 µm. As a result, the HC threshold hardly changed depending on the pulse width. Half-cuts having about the same quality were generated at the same pulse energy.

In the results of experiments in FIG. 33, under the irradiation with the laser light L at each of pulse pitches of 10 µm, 12 µm, 14 µm, 16 µm, and 18 µm, the state of half-cuts was observed while changing the pulse energy within the range of 7 µJ to 12 µJ. The pulse width of the laser light L was fixed at 57 ns, while the converging point position was fixed at 34.5 µm. As a result, the quality of half-cuts hardly changed depending on the pulse width. At the converging point position of 34.5 µm, half cuts having about the same quality was generated by the same pulse energy.

Another laser processing method for suppressing c-plane fissures will now be explained. First, a planar object to be processed 1 comprising a hexagonal SiC substrate 12 having a front face 12a forming an angle corresponding to an off-angle with the c-plane is prepared, and lines to cut 5a, 5m are set. Subsequently, as illustrated in FIG. 34(a), the object 1 is irradiated with laser light L along each of two preliminary lines 5p set on both sides of the line 5a (5m), while locating the converging point P of the laser light L within the SiC substrate 12. This forms preliminary modified regions 7p within the SiC substrate 12 along each preliminary line 5p. The preliminary modified regions 7p include molten processed regions.

The preliminary lines 5p are lines positioned on both sides of the line 5a (5m) within a plane parallel to the front face 12a while extending in a direction parallel to the line 5a (5m). In the case where a functional device is formed in each region defined by the lines 5a, 5m on the front face 12a of the SiC substrate 12, the preliminary lines 5p are preferably set within regions between adjacent functional devices when seen in the thickness direction of the SiC substrate 12.

When irradiating the object 1 with the laser light L along each preliminary line 5p, fractures are made harder to occur in the SiC substrate 12 from the preliminary modified regions 7p than from the modified regions 7a (7m) to become cutting start points. By reducing the pulse energy, pulse pitch, pulse width, and the like of the laser light L, the preliminary modified regions 7p can be made harder to generate fractures in the SiC substrate 12 than do the modified regions 7a (7m) to become cutting start points.

After forming the preliminary modified regions 7p along the preliminary lines 5p, the object 1 is irradiated with the laser light L along the line 5a (5m) while locating the converging point P of the laser light L within the SiC substrate 12. This forms the modified regions 7a (7m) to become cutting start points within the SiC substrate 12 along the line 5a (5m). The modified regions 7a (7m) include molten processed regions. After forming the modified regions 7a (7m) along the line 5a (5m), the object 1 is cut along the line 5a (5m) from the modified regions 7a (7m) acting as start points.

Because of the following reasons, the foregoing laser processing method can accurately cut along the lines 5a, 5m the planar object 1 comprising the hexagonal SiC substrate 12 having the front face 12a forming an angle corresponding to the off-angle with the c-plane, thereby yielding pieces of the object 1 (i.e., power devices) precisely cut along the lines 5a, 5m.

When forming the modified regions 7a (7m) within the SiC substrate 12 along the line 5a (5m), the preliminary modified regions 7p have been formed within the SiC substrate 12 along each preliminary line 5p. The preliminary lines 5p are located on both sides of the line 5a (5m) within a plane parallel to the front face 12a while extending in a direction parallel to the line 5a (5m). Therefore, the preliminary modified regions 7p inhibit fractures (c-plane fissures), if any, from extending in the c-plane direction from the modified region 7a (7m) as illustrated in FIG. 34(a) than in the case without the preliminary modified regions 7p as illustrated in FIG. 34(b). This makes it possible to irradiate the object 1 with laser light so as to make fractures easier to extend in the thickness direction of the SiC substrate 12 from the modified region 7a (7m) regardless of whether it becomes easier for fractures to extend in the c-plane direction from the modified region 7a (7m) or not. The preliminary modified regions 7p, which are not required to function as cutting start points (i.e., to promote the extension of fractures in the thickness direction of the SiC substrate 12 from the preliminary modified regions 7p), are formed by such irradiation with the laser light L that fractures are harder to occur in the SiC substrate 12, whereby fractures can easily be inhibited from extending in the c-plane direction from the preliminary modified regions 7p when forming the latter. Therefore, the planar object comprising the hexagonal SiC substrate 12 having a main surface forming an angle corresponding to the off-angle with the c-plane can accurately be cut along the line 5a (5m).

When locating the converging point P of the laser light L at a predetermined distance from the front face 12a acting as the laser light entrance surface of the SiC substrate 12 at the time of forming the modified region 7a (7m), it will be preferred if the converging point P of the laser light L is placed at the same distance from the front face 12a at the time of forming the preliminary modified region 7p. This can more securely inhibit fractures from extending in the c-plane direction from the modified region 7a (7m).

Forming the preliminary modified regions 7p within the SiC substrate 12 along each preliminary line 5p and the modified regions 7a (7m) within the SiC substrate 12 along the line 5a (5m) set between the preliminary lines 5p at the same time also allows the preliminary modified regions 7p to inhibit c-plane fissures from extending. In this case, it is preferable to form the preliminary modified regions 7p along the preliminary lines 5p prior to the modified regions 7a (7m) along the lines 5a (5m).

INDUSTRIAL APPLICABILITY

The present invention can cut a planar object to be processed comprising a hexagonal SiC substrate having a main surface forming an angle corresponding to an off-angle with a c-plane, accurately along a line to cut.

REFERENCE SIGNS LIST

1 . . . object to be processed; 5a, 5m . . . line to cut; 5p . . . preliminary line; 7a, 7m . . . modified region; 7p . . . preliminary modified region; 12 . . . SiC substrate;

12a . . . front face (main surface); 12b . . . rear face (main surface); L . . . laser light; P . . . converging point

The invention claimed is:

1. A laser processing method for cutting a planar object to be processed along a cutting line, the planar object comprising a hexagonal SiC substrate having a main surface forming an angle corresponding to an off-angle with respect to a c-plane of the hexagonal SiC substrate, wherein the cutting line includes a plurality of first and second cutting lines that are arranged as a grid with the first cutting lines intersecting the second cutting lines, the first cutting lines extending in parallel to the main surface and an a-plane of the hexagonal SiC substrate, and the second cutting lines extending in parallel to the main surface and an m-plane of the hexagonal SiC substrate, the method comprising:

irradiating the object with laser light pulse-oscillated at a pulse width of 50 ns to 100 ns along the first and second cutting lines at a pulse pitch of 12 µm to 18 µm while locating a converging point of the laser light within the SiC substrate, thereby forming modified regions each serving as a cutting start point within the SiC substrate along the cutting lines, wherein the irradiating of the object with the laser light causes formation of first rows of the modified regions aligned with each other in the thickness direction of the SiC substrate along each of the first cutting lines, and causes formation of second rows of the modified regions aligned with each other in the thickness direction of the SiC substrate along each of the second cutting lines, wherein number of second rows is smaller than that of the first rows;

cutting the object along each of the second cutting lines using the second rows of the modified regions as start points after irradiating the object with the laser light; and cutting the object along each of the first cutting lines using the first rows of the modified regions as start points after cutting the object along each of the second cutting lines, wherein, in each of the first and second rows, each modified region formed second closest to the main surface is smaller than the modified region formed closest to the main surface.

2. A laser processing method according claim 1, wherein each modified region includes a molten processed region.

3. A laser processing method according claim 1, wherein performance of the irradiating and cutting steps yields a plurality of SiC chips.

4. A laser processing method for cutting a planar object to be processed along a cutting line, the planar object comprising a hexagonal SiC substrate having a main surface forming an angle corresponding to an off-angle with respect to a c-plane of the hexagonal SiC substrate, wherein the cutting line includes a plurality of first and second cutting lines that are arranged as a grid with the first cutting lines intersecting the second cutting lines, the first cutting lines extending in parallel to the main surface and an a-plane of the hexagonal SiC substrate, and the second cutting lines extending in parallel to the main surface and an m-lane of the hexagonal SiC substrate, the method comprising:

irradiating the object with pulse-oscillated laser light along the first and second cutting lines at a pulse pitch of 14 µm to 18 µm while locating a converging point of the laser light within the SiC substrate, thereby forming modified regions each serving as a cutting start point within the SiC substrate along the cutting lines, wherein the irradiating of the object with the laser light causes formation of first rows of the modified regions aligned with each other in the thickness direction of the SiC substrate along each of the first cutting lines, and causes formation of second rows of the modified regions aligned with each other in the thickness direction of the SiC substrate along each of the second cutting lines, wherein number of second rows is smaller than that of the first rows, cutting the object along each of the second cutting lines using the second rows of the modified regions as start points after irradiating the object with the laser light; and cutting the object along each of the first cutting lines using the first rows of the modified regions as start points after cutting the object along each of the second cutting lines, wherein, in each of the first and second rows, each modified region formed second closest to the main surface is smaller than the modified region formed closest to the main surface.

5. A laser processing method according claim 4, wherein each modified region includes a molten processed region.

6. A laser processing method according claim 4, wherein performance of the irradiating and cutting steps yields a plurality of SiC chips.

\* \* \* \* \*

UNITED STATES PATENT AND TRADEMARK OFFICE
CERTIFICATE OF CORRECTION

PATENT NO.         : 10,532,431 B2
APPLICATION NO.    : 15/043295
DATED              : January 14, 2020
INVENTOR(S)        : Junji Okuma et al.

Page 1 of 1

It is certified that error appears in the above-identified patent and that said Letters Patent is hereby corrected as shown below:

On the Title Page

At item (71) Applicant, "HAMAMATSU PHOTONIC K.K." should read --HAMAMATSU PHOTONICS K.K.--.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*